US012647132B2

(12) United States Patent
 Ignatchenko

(10) Patent No.: US 12,647,132 B2
(45) Date of Patent: Jun. 2, 2026

(54) SYSTEMS AND METHODS FOR IMPROVING COMPRESSION OF STRUCTURED DATA IN THREE-DIMENSIONAL APPLICATIONS

(71) Applicant: Six Impossible Things Before Breakfast Limited, Dublin (IE)

(72) Inventor: Sherry Ignatchenko, Weidling (AT)

(73) Assignee: Six Impossible Things Before Breakfast Limited, Dublin (IE)

( * ) Notice: Subject to any disclaimer, the term of this patent is extended or adjusted under 35 U.S.C. 154(b) by 172 days.

(21) Appl. No.: 18/438,702

(22) Filed: Feb. 12, 2024

(65) Prior Publication Data

US 2024/0275404 A1 Aug. 15, 2024

Related U.S. Application Data

(60) Provisional application No. 63/484,686, filed on Feb. 13, 2023.

(51) Int. Cl.
 *H03M 7/30* (2006.01)
 *G06F 16/22* (2019.01)
(52) U.S. Cl.
 CPC ....... *H03M 7/6011* (2013.01); *G06F 16/2264* (2019.01)
(58) Field of Classification Search
 CPC .......................... H03M 7/6011; G06F 16/2264
 (Continued)

(56) References Cited

U.S. PATENT DOCUMENTS 5,764,804 A * 6/1998 Yajima .................... G06T 9/004
 380/54
12,530,320 B2 * 1/2026 Ezrielev .............. G06F 16/1744
 (Continued)

FOREIGN PATENT DOCUMENTS

WO WO 2024/171025 8/2024
WO WO 2024/171028 8/2024

OTHER PUBLICATIONS

Portaneri et al., "Cost-Driven Framework for Progressive Compression of Textured Meshes," *ACM 2019—10th Multimedia Systems Conference*, pp. 175-188 (Jun. 2019) (electronic publication).
 (Continued)

*Primary Examiner* — Dominic D Saltarelli
(74) *Attorney, Agent, or Firm* — Arnold & Porter Kaye Scholer LLP

(57) ABSTRACT

Systems and methods for encoding and compressing structured data for rendering computer-generated graphics in three-dimensional applications are described herein. In various implementations, structured data may be encoded into an intermediate symbol stream using frequency tables specifically for a type of structured data object, field, or value being encoded. In some implementations, additional information may be incorporated into the symbols used to encode individual structured data objects. In some implementations, structured data objects may be encoded based on a context associated with the structured data object. Once structured data is encoded as an intermediate symbol stream, the intermediate symbol stream may be compressed using one or more entropy coding methods. By taking into account the underlying structure of the data, the systems and methods described herein reduce redundancies, thereby improving compression of the structured data.

26 Claims, 11 Drawing Sheets

(58) Field of Classification Search
USPC ......................................................... 375/377
See application file for complete search history.

(56) References Cited

U.S. PATENT DOCUMENTS

| | | |
|---|---|---|
| 2010/0202378 A1 | 8/2010 | Youn et al. |
| 2024/0257401 A1 | 8/2024 | Ignatchenko et al. |
| 2024/0257402 A1 | 8/2024 | Ignatchenko |
| 2024/0264990 A1* | 8/2024 | Kumar ................ G06F 16/2219 |
| 2024/0273769 A1 | 8/2024 | Ignatchenko |

OTHER PUBLICATIONS

"GlTF™ 2.0 Specification," available from https://registry.khronos.org/glTF/specs/2.0/glTF-2.0.html.

"Draco Bitstream Specification," Ver. 2.2, released Oct. 25, 2017, last modified Feb. 6, 2024, available from https://google.github.io/draco/spec/.

Ark et al., "What is 'compressed JSON'?—Stack Overflow," retrieved from the Internet (https://stackoverflow.com/questions/4201647/what-is-compressed-json) (Jun. 2017).

Aubault et al., "Real-Time Reconstruction of Wavelet-Encoded Meshes for View-Dependent Transmission and Visualization," *IEEE Transactions on Circuits and Systems for Video Technology*, 14(7), pp. 1009-1020 (Jul. 2004) (Hoboken, New Jersey, US).

"Bézier triangle," *Wikipedia, The Free Encyclopedia*, retrieved from the Internet (https://en.wikipedia.org/w/index.php?title=Bézier_triangle&oldid=1060649142), pp. 1-4 (Dec. 2021) (electronic publication).

Collet et al., "Smaller and faster data compression with Zstandard—Engineering at Meta," retrieved from the Internet (https://engineering.fb.com/2016/08/31/core-infra/smaller-and-faster-data-compression-with-zstandard/) (Apr. 2024) (electronic publication).

Corral, "JSONC—Read Me," *github*, pp. 1-2, retrieved from the Internet (https:/github.com/tcorral/JSONC/blob/master/README.md) (Dec. 2017) (electronic publication).

Fielder, "Snapshot Compression," Networked Physics, available at https://gafferongames.com/post/snapshot_compression/ (May 2024).

Fielder, "Snapshot Interpolation," Networked Physics, available at https://gafferongames.com/post/snapshot_interpolation/ (May 2024).

International Search Report dated Jun. 17, 2024, issued in Int'l Application No. PCT/IB2024/051295.

International Search Report dated Jun. 20, 2024, issued in Int'l Application No. PCT/IB2024/051290.

Jiangzhoongshi, "The Basic Structure of glTF. gltf-Tutorials," pp. 1-4, retrieved from the Internet (https://github.com/KronosGroup/glTF-Tutorials/blob/main/gltfTutorial/gltfTutorial_002_BasicGltfStructure.md) (Sep. 2022).

Rolyrolls et al., "c#—Json. Net Combine 2 Properties in Serialization—Stack Overflow," pp. 1-6, retrieved from the Internet (https://stackoverflow.com/questions/45509826/json-net-combine-2-properties-on-sereialization) (Aug. 2017).

Rossignac, "Edgebreaker: Connectivity Compression for Triangle Meshes," *Computer Graphics, IEEE* 5(1), pp. 47-61 (Jan. 1999) (Hoboken, New Jersey, US).

Severo et al., "Compressing Multisets with Large Alphabets," *2022 Data Compression Conference (DCC) IEEE*, pp. 322-331 (Mar. 2022) (Hoboken, New Jersey, US).

* cited by examiner

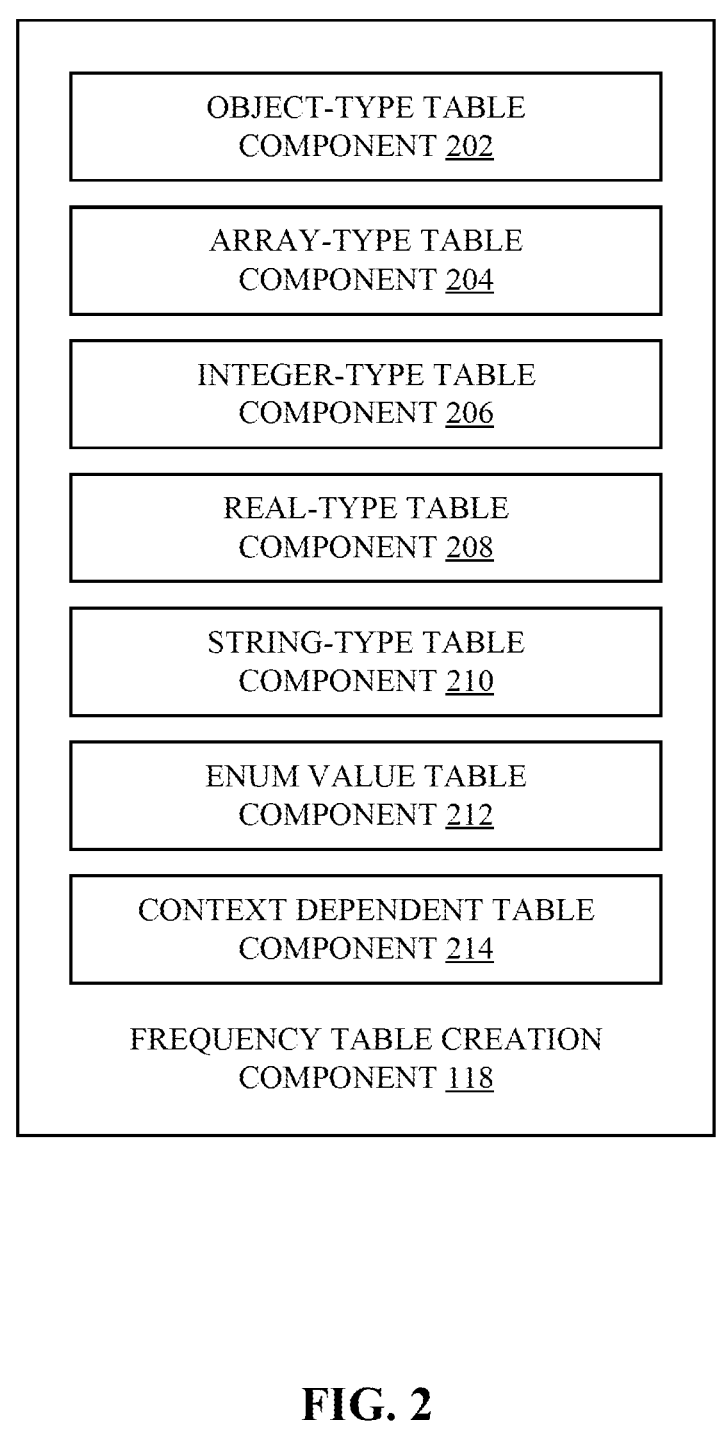

OBJECT-TYPE TABLE
COMPONENT 202

ARRAY-TYPE TABLE
COMPONENT 204

INTEGER-TYPE TABLE
COMPONENT 206

REAL-TYPE TABLE
COMPONENT 208

STRING-TYPE TABLE
COMPONENT 210

ENUM VALUE TABLE
COMPONENT 212

CONTEXT DEPENDENT TABLE
COMPONENT 214

FREQUENCY TABLE CREATION
COMPONENT 118

FIG. 2

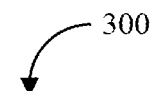
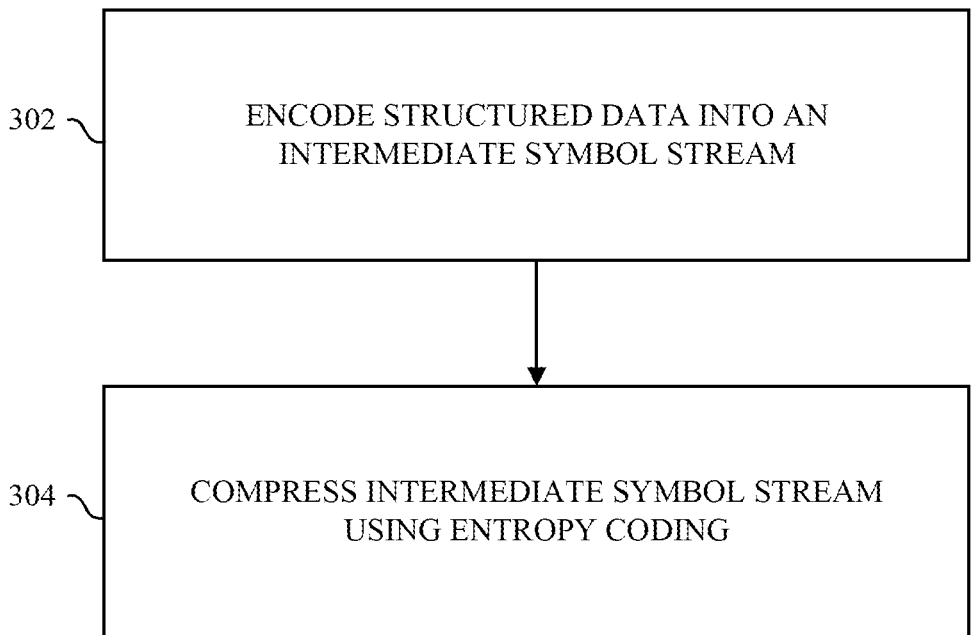
302 ENCODE STRUCTURED DATA INTO AN INTERMEDIATE SYMBOL STREAM
304 COMPRESS INTERMEDIATE SYMBOL STREAM USING ENTROPY CODING
FIG. 3

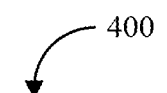
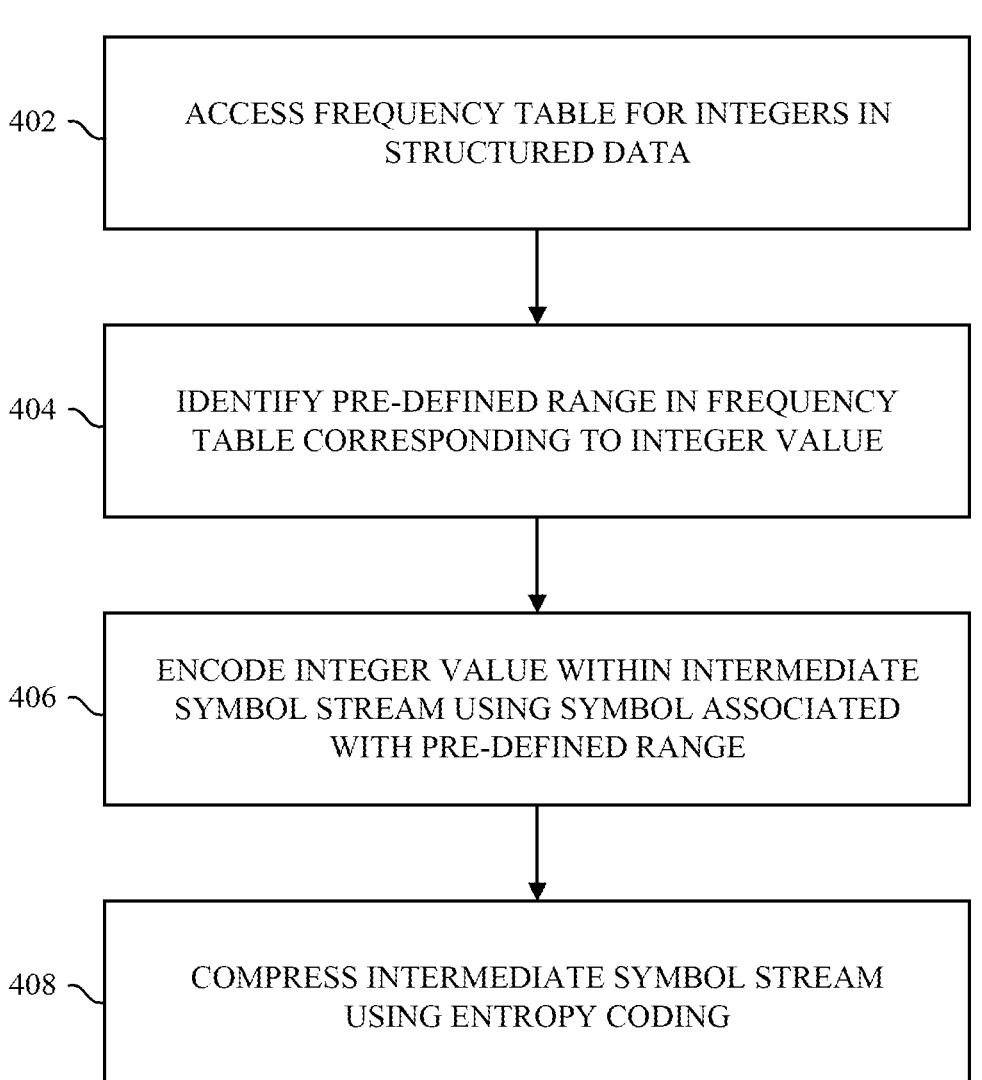
402 — ACCESS FREQUENCY TABLE FOR INTEGERS IN STRUCTURED DATA
404 — IDENTIFY PRE-DEFINED RANGE IN FREQUENCY TABLE CORRESPONDING TO INTEGER VALUE
406 — ENCODE INTEGER VALUE WITHIN INTERMEDIATE SYMBOL STREAM USING SYMBOL ASSOCIATED WITH PRE-DEFINED RANGE
408 — COMPRESS INTERMEDIATE SYMBOL STREAM USING ENTROPY CODING
FIG. 4

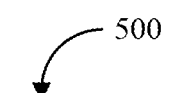
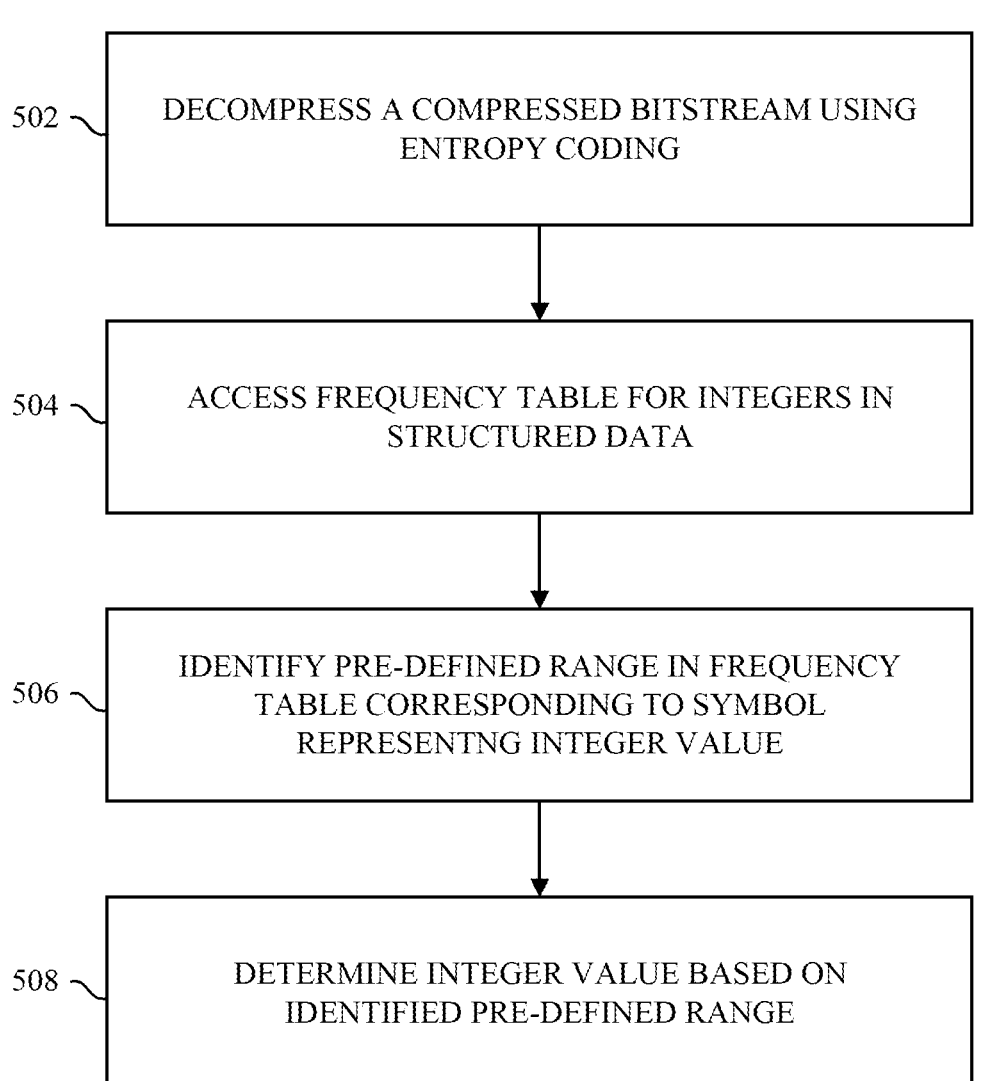
502 — DECOMPRESS A COMPRESSED BITSTREAM USING ENTROPY CODING
504 — ACCESS FREQUENCY TABLE FOR INTEGERS IN STRUCTURED DATA
506 — IDENTIFY PRE-DEFINED RANGE IN FREQUENCY TABLE CORRESPONDING TO SYMBOL REPRESENTNG INTEGER VALUE
508 — DETERMINE INTEGER VALUE BASED ON IDENTIFIED PRE-DEFINED RANGE
FIG. 5

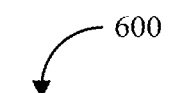
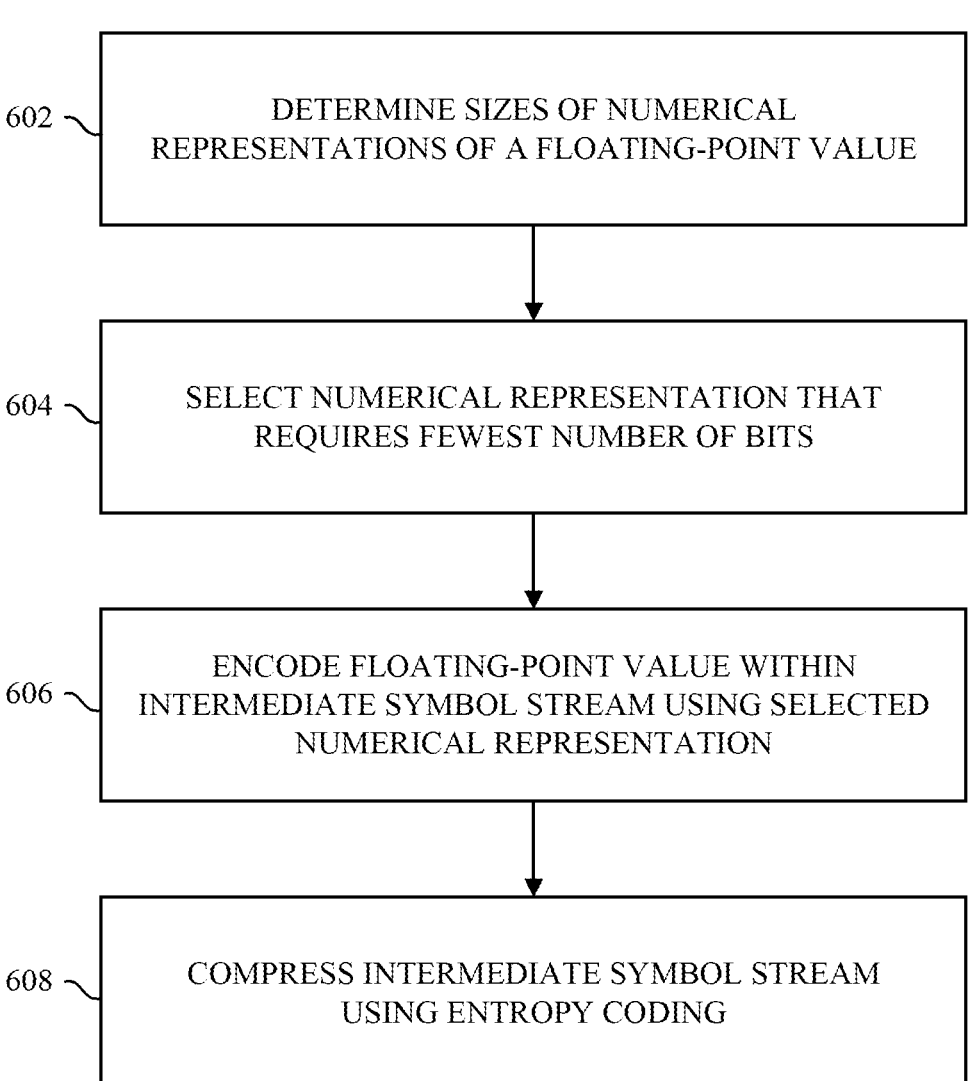
602 — DETERMINE SIZES OF NUMERICAL REPRESENTATIONS OF A FLOATING-POINT VALUE
604 — SELECT NUMERICAL REPRESENTATION THAT REQUIRES FEWEST NUMBER OF BITS
606 — ENCODE FLOATING-POINT VALUE WITHIN INTERMEDIATE SYMBOL STREAM USING SELECTED NUMERICAL REPRESENTATION
608 — COMPRESS INTERMEDIATE SYMBOL STREAM USING ENTROPY CODING
FIG. 6

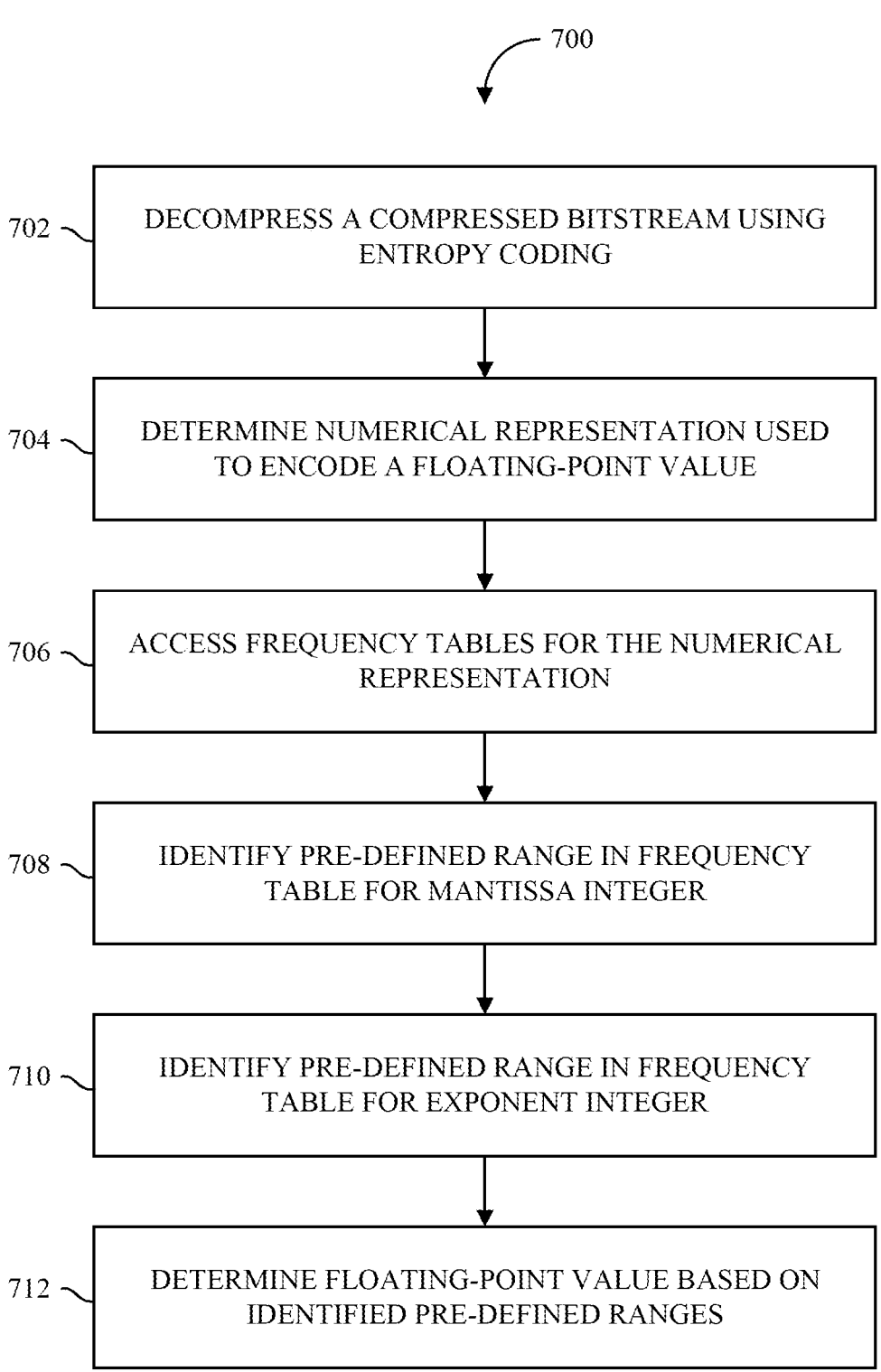

702 — DECOMPRESS A COMPRESSED BITSTREAM USING ENTROPY CODING

704 — DETERMINE NUMERICAL REPRESENTATION USED TO ENCODE A FLOATING-POINT VALUE

706 — ACCESS FREQUENCY TABLES FOR THE NUMERICAL REPRESENTATION

708 — IDENTIFY PRE-DEFINED RANGE IN FREQUENCY TABLE FOR MANTISSA INTEGER

710 — IDENTIFY PRE-DEFINED RANGE IN FREQUENCY TABLE FOR EXPONENT INTEGER

712 — DETERMINE FLOATING-POINT VALUE BASED ON IDENTIFIED PRE-DEFINED RANGES

FIG. 7

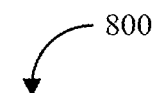
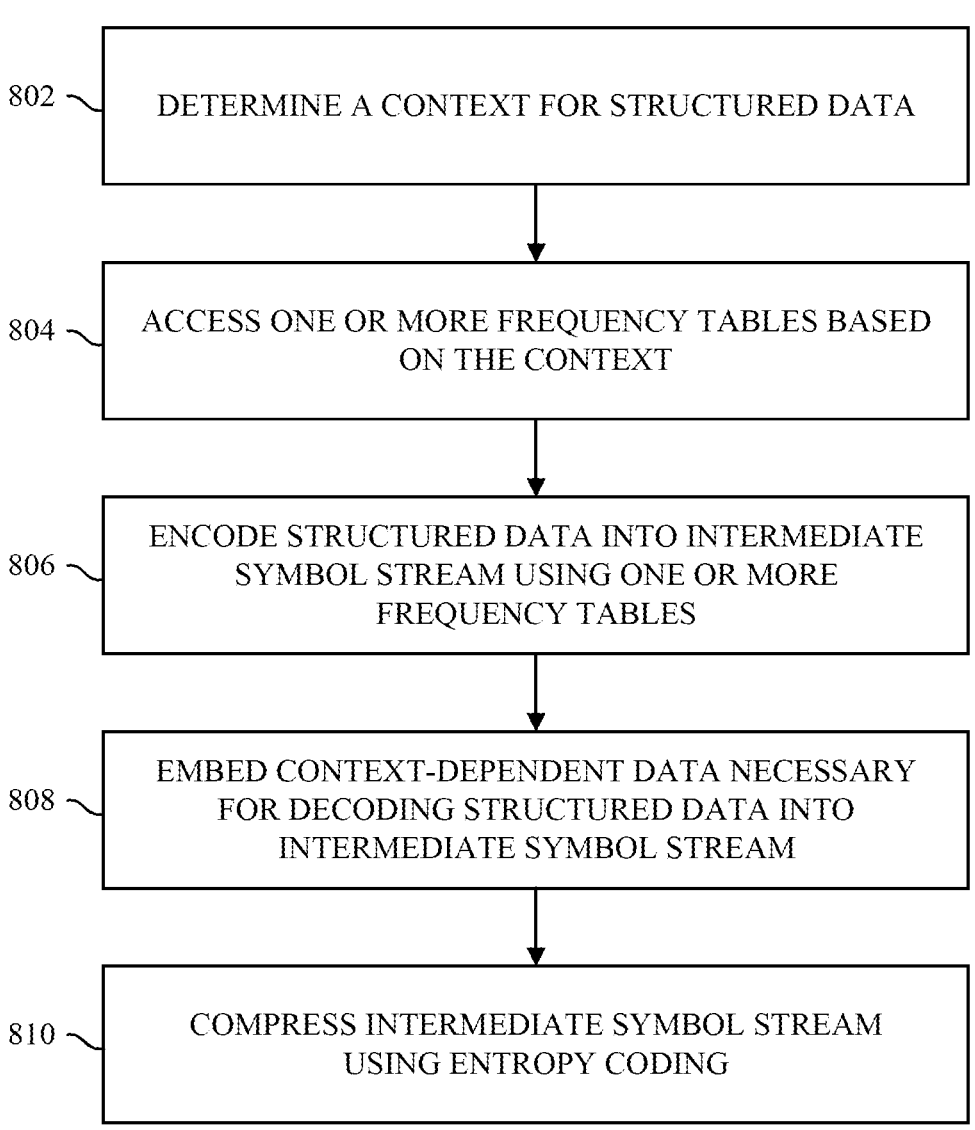
802 — DETERMINE A CONTEXT FOR STRUCTURED DATA
804 — ACCESS ONE OR MORE FREQUENCY TABLES BASED ON THE CONTEXT
806 — ENCODE STRUCTURED DATA INTO INTERMEDIATE SYMBOL STREAM USING ONE OR MORE FREQUENCY TABLES
808 — EMBED CONTEXT-DEPENDENT DATA NECESSARY FOR DECODING STRUCTURED DATA INTO INTERMEDIATE SYMBOL STREAM
810 — COMPRESS INTERMEDIATE SYMBOL STREAM USING ENTROPY CODING
FIG. 8

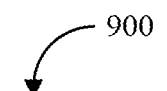
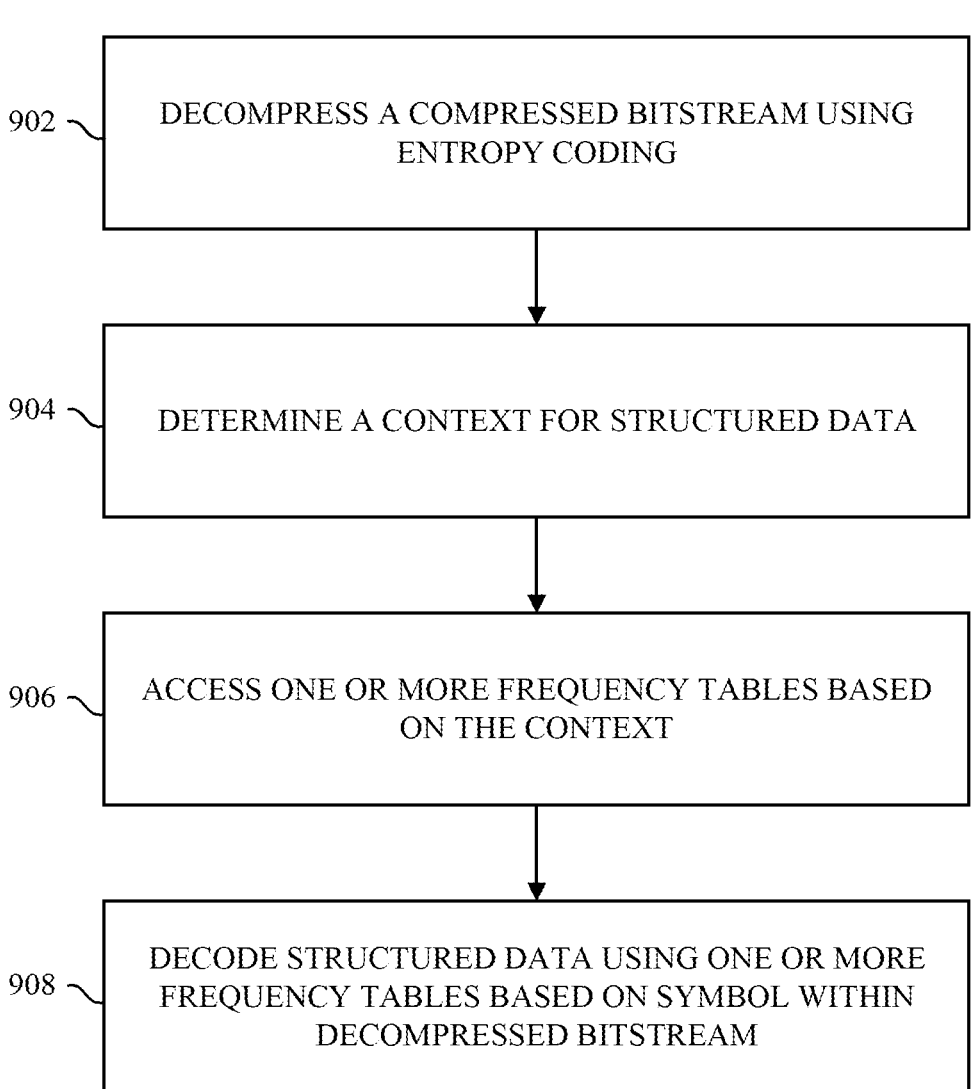
902 — DECOMPRESS A COMPRESSED BITSTREAM USING ENTROPY CODING
904 — DETERMINE A CONTEXT FOR STRUCTURED DATA
906 — ACCESS ONE OR MORE FREQUENCY TABLES BASED ON THE CONTEXT
908 — DECODE STRUCTURED DATA USING ONE OR MORE FREQUENCY TABLES BASED ON SYMBOL WITHIN DECOMPRESSED BITSTREAM
FIG. 9

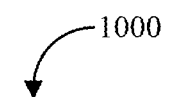

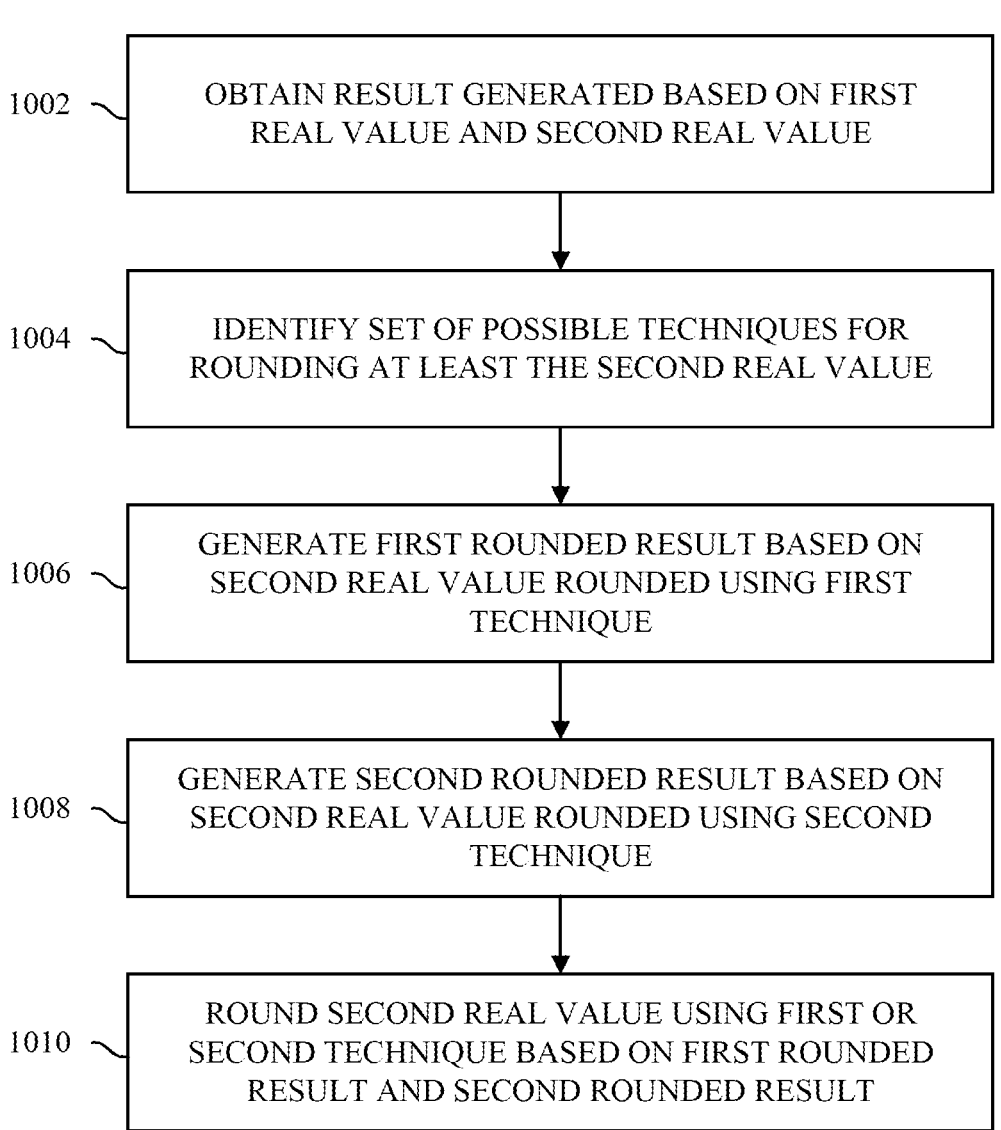

1002 — OBTAIN RESULT GENERATED BASED ON FIRST REAL VALUE AND SECOND REAL VALUE

1004 — IDENTIFY SET OF POSSIBLE TECHNIQUES FOR ROUNDING AT LEAST THE SECOND REAL VALUE

1006 — GENERATE FIRST ROUNDED RESULT BASED ON SECOND REAL VALUE ROUNDED USING FIRST TECHNIQUE

1008 — GENERATE SECOND ROUNDED RESULT BASED ON SECOND REAL VALUE ROUNDED USING SECOND TECHNIQUE

1010 — ROUND SECOND REAL VALUE USING FIRST OR SECOND TECHNIQUE BASED ON FIRST ROUNDED RESULT AND SECOND ROUNDED RESULT

FIG. 10

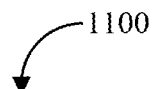
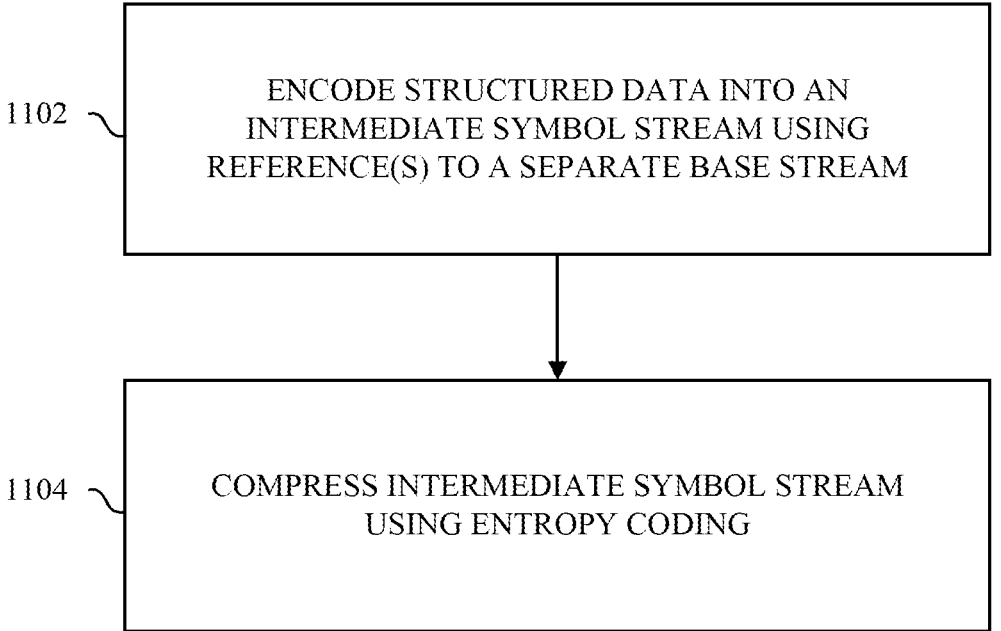
1102 — ENCODE STRUCTURED DATA INTO AN INTERMEDIATE SYMBOL STREAM USING REFERENCE(S) TO A SEPARATE BASE STREAM
1104 — COMPRESS INTERMEDIATE SYMBOL STREAM USING ENTROPY CODING
FIG. 11

SYSTEMS AND METHODS FOR IMPROVING COMPRESSION OF STRUCTURED DATA IN THREE-DIMENSIONAL APPLICATIONS

RELATED APPLICATIONS

This application claims priority to U.S. Provisional Application No. 63/484,686, entitled "Method for Efficient Compression of JSON part of GLTF File Format," filed on Feb. 13, 2023, the content of which is hereby incorporated herein by reference in its entirety.

FIELD OF THE DISCLOSURE

The systems and methods described herein relate to improvements to the compression of structured data used for rendering computer-generated graphics in three-dimensional applications.

BACKGROUND

In three-dimensional applications, JavaScript Object Notation (or "JSON") is a commonly used file format for storing data. The JSON file format uses human-readable text to store and transmit data objects consisting of attribute-value pairs and arrays (or other serializable values). The JSON file format is part of the glTF and GLB file formats, which are standard file formats used by three-dimensional applications (e.g., virtual reality (VR), augmented reality (AR), gaming, and/or other three-dimensional applications) to store three-dimensional scenes and models. The highly redundant nature of the JSON file format results in a relatively large file size. Unfortunately, conventional techniques for compressing JSON files (and other file formats with structured data) do not take into account their underlying data structure. As such, there is a need in the art for improved technique(s) for compressing structured data in JSON files and/or other similar file formats.

SUMMARY OF THE DISCLOSURE

This disclosure relates to systems and methods for encoding and compressing structured data for rendering computer-generated graphics in three-dimensional applications. In various implementations, the structured data may comprise JavaScript Object Notation (JSON) data. For example, the structured data may comprise a JSON part of a glTF or GLB file. In various implementations, the structured data may be encoded into an intermediate symbol stream. For example, each structured data object of the structured data may be encoded as a sequence of "(name, type, value)" triplets. The symbol used to encode the name and type of a structured data object may represent a (name, type) pair of the (name, type, value) triplet for that structured data object. In various implementations, the pre-defined symbols used to encode the structured data may be identified using frequency tables. The frequency table used may be determined based on the type of structured data object, field, or value being encoded. For example, the different frequency tables accessible by the systems and methods described herein may be specific to objects, arrays, integer values, real values, strings, enum values, and/or other types of structured data objects, fields, or values. Once structured data is encoded as an intermediate symbol stream, the intermediate symbol stream may be compressed using one or more entropy coding methods. For example, the one or more entropy coding methods may comprise Huffman coding, arithmetic coding, one of the asymmetric numeral systems (ANS) family of entropy coding methods, and/or one or more other entropy coding methods. The one or more frequency tables used to encode the intermediate symbol stream may be embedded within the compressed bitstream or may be embedded within a compressor and decompressor used to compress the intermediate symbol stream and decompress the resulting compressed bitstream. By taking into account the structure of the underlying data, the systems and methods described herein reduce the effect of the redundant nature of structed data, thereby improving compression of the structured data.

According to one aspect of the invention, the systems and methods described herein may incorporate additional information related to a structured data object into symbol(s) used to encode the structured data object. For example, multiple symbols for a given (name, type) pair may be included within a frequency table for that pair, and the symbol used to encode the name and type of a structured data object having that (name, type) pair may be selected based on the additional information. In some implementations, the selected symbol may indicate a type of numerical representation used to encode a real-value field associated with a structured data object, a pre-defined range of an integer field associated with a structured data object, whether an integer field associated with a structured data object is signed or unsigned, whether a Boolean field associated with a structured data object is true or false, and/or other information related to the structured data object.

According to another aspect of the invention, the systems and methods described herein may be configured to encode structured data objects based on a context associated with the structured data object. A "context" may refer to a given encoding situation, such as when a specific element, item, object, file, and/or application is being encoded. Depending on the context of a structured data object, one or more specific frequency tables for that context may be accessed and used to encode the structured data object. In some implementations, frequency tables to be used to encode structured data may be organized into a hierarchy based on a hierarchy of the structured data. In such implementations, the context for the portion of the structured data may be determined based on a position of the portion of the structured data within the structured data. In some implementations, contexts used to encode structured data may be switched automatically based on a current position of the data being parsed in the data structure. In various implementations, context-dependent data necessary for decoding the structured data may be embedded into the intermediate symbol stream.

According to another aspect of the invention, the systems and methods described herein may encode dynamic game state data by encoding the dynamic game state data into an intermediate symbol stream using references to a separate base stream. For example, the dynamic game state data may comprise structured data having at least one object or field, and the structured data may be encoded by referencing a base stream comprising the same object or field. In some implementations, any referenced data in a given stream (e.g., the portion of the base stream referenced in the intermediate symbol stream) may be copied to or otherwise included within the intermediate symbol stream. In various implementations, the object or field in the structured data may be encoded into the intermediate symbol stream as a difference between the object or field in the base stream and the object or field in the structured data. In some implementations, the difference between the object or field in the base stream and the object or field in the structured data is encoded as a manipulation operator. A manipulation operator may identify an operation to perform on an object, element, or other piece of data to produce an updated version of the object, element, or other piece of data. In various implementations, in response to a data structure being updated, a manipulation operator may be automatically generated to reflect the update. In some implementations, this manipulation operator may be automatically generated without identifying differences between the base stream and the structured data. In other words, the manipulation operator may be automatically generated based solely on the updates to the data structure on an encoding side.

These and other objects, features, and characteristics of the systems and/or methods disclosed herein, as well as the methods of operation and functions of the related elements of structure and the combination thereof, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

The present invention is illustrated by way of example and not limited in the accompanying figures in which like reference numerals indicate similar elements and in which:

FIG. 2 depicts a block diagram of an example frequency table creation component configured to create frequency tables used to encode symbols within an intermediate symbol stream, according to one or more aspects described herein;

FIG. 3 depicts a flow diagram of an example of a method for compressing structured data using entropy coding, according to one or more aspects described herein;

FIG. 4 depicts a flow diagram of an example of a method for compressing integer values in structured data, according to one or more aspects described herein;

FIG. 5 depicts a flow diagram of an example of a method for decompressing structured data comprising integer values, according to one or more aspects described herein;

FIG. 6 depicts a flow diagram of an example of a method for compressing floating-point values in structured data, according to one or more aspects described herein;

FIG. 7 depicts a flow diagram of an example of a method for decompressing structured data comprising floating-point values, according to one or more aspects described herein;

FIG. 8 depicts a flow diagram of an example of a method for performing context-dependent entropy-based compression of structured data, according to one or more aspects described herein;

FIG. 9 depicts a flow diagram of an example of a method for performing context-dependent entropy-based decompression of structured data, according to one or more aspects described herein;

FIG. 10 depicts a flow diagram of an example of a method for improving compression by automatically limiting precision of real values within structured data, according to one or more aspects described herein; and FIG. 11 depicts a flow diagram of an example of a method for compressing dynamic game state data, according to one or more aspects described herein.

Figure 1:
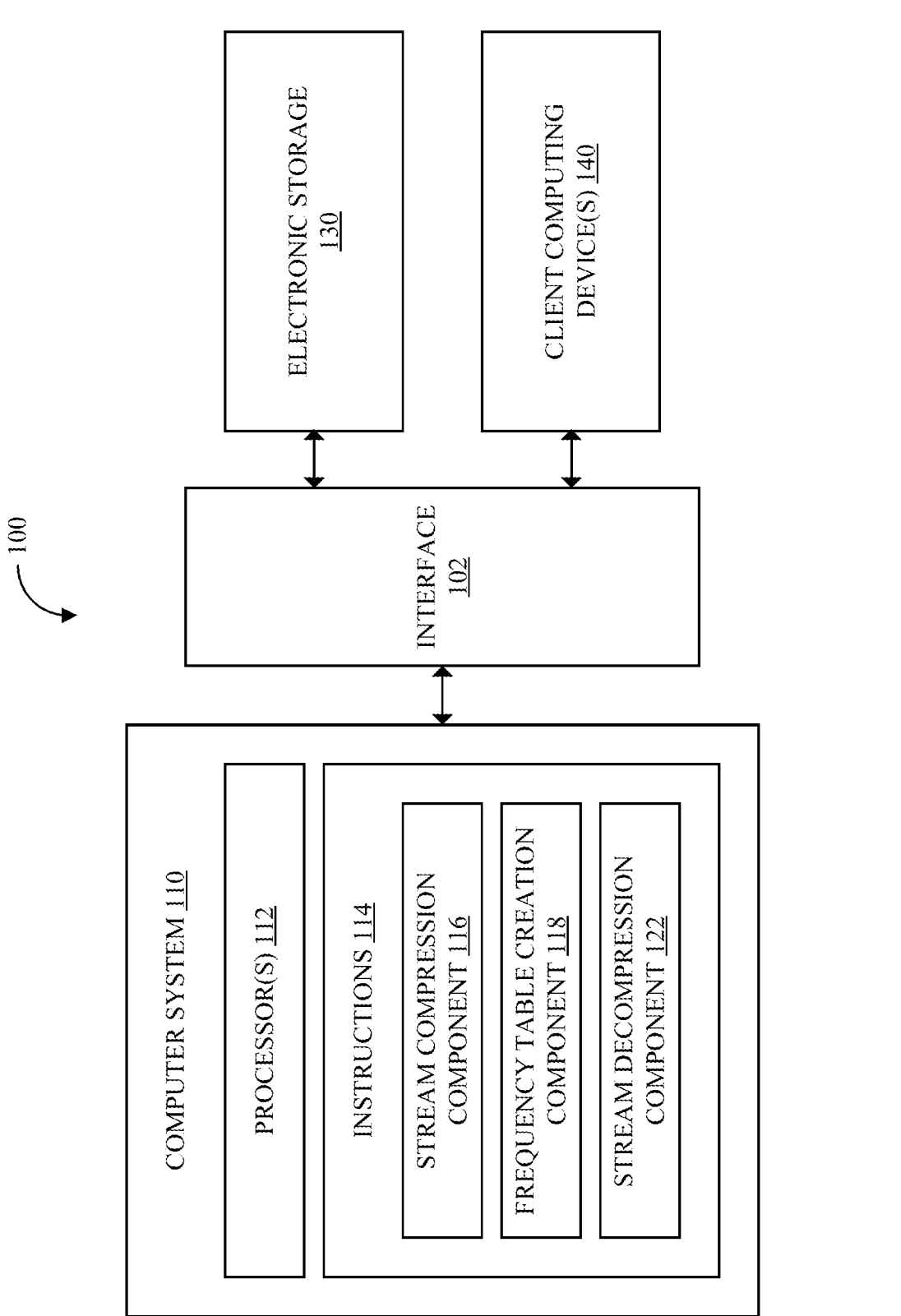
FIG. 1 depicts a block diagram of an example of a system configured to compress structured data used for rendering computer-generated graphics in three-dimensional applications, according to one or more aspects described herein.

These drawings are provided for purposes of illustration only and merely depict typical or example embodiments. These drawings are provided to facilitate the reader's understanding and shall not be considered limiting of the breadth, scope, or applicability of the disclosure. For clarity and ease of illustration, these drawings are not necessarily drawn to scale.

DETAILED DESCRIPTION

Certain illustrative aspects of the systems and methods according to the present invention are described herein in connection with the following description and the accompanying figures. These aspects are indicative, however, of but a few of the various ways in which the principles of the invention may be employed and the present invention is intended to include all such aspects and their equivalents. Other advantages and novel features of the invention may become apparent from the following detailed description when considered in conjunction with the figures.

In the following detailed description, numerous specific details are set forth in order to provide a thorough understanding of the invention. In other instances, well known structures, interfaces, and processes have not been shown in detail in order not to unnecessarily obscure the invention. However, it will be apparent to one of ordinary skill in the art that those specific details disclosed herein need not be used to practice the invention and do not represent a limitation on the scope of the invention, except as recited in the claims. It is intended that no part of this specification be construed to effect a disavowal of any part of the full scope of the invention. Although certain embodiments of the present disclosure are described, these embodiments likewise are not intended to limit the full scope of the invention.

FIG. 1 illustrates an example of a system 100 for compressing structured data used for rendering computer-generated graphics in three-dimensional applications, according to one or more aspects described herein. In various implementations, system 100 may include one or more of interface 102, a computer system 110, electronic storage 130, client computing device(s) 140, and/or other components. In various implementations, computer system 110 may include one or more physical processors 112 (also interchangeably referred to herein as processor(s) 112, processor 112, or processors 112 for convenience), computer readable instructions 114, and/or one or more other components. In some implementations, system 100 may include one or more external resources, such as sources of information outside of system 100, external entities participating with system 100, and/or other resources. In various implementations, system 100 may be configured to receive input from or otherwise interact with one or more users via one or more client computing device(s) 140.

In various implementations, physical processor(s) 112 may be configured to provide information processing capabilities in system 100. As such, the processor(s) 112 may comprise one or more of a digital processor, an analog processor, a digital circuit designed to process information, a central processing unit, a graphics processing unit, a microcontroller, a microprocessor, a field programmable gate array (FPGA), an application specific integrated circuit (ASIC), a System on a Chip (SoC), and/or other mechanisms for electronically processing information. Processor(s) 112 may be configured to execute one or more computer readable instructions 114. Computer readable instructions 114 may include one or more computer program components. In various implementations, computer readable instructions 114 may include one or more of stream compression component 116, frequency table creation component 118, stream decompression component 120, and/or other computer program components. As used herein, for convenience, the various computer readable instructions 114 will be described as performing an operation, when, in fact, the various instructions program the processor(s) 112 (and therefore system 100) to perform the operation.

Stream compression component 116 may be configured to encode and compress structured data for rendering computer-generated graphics in three-dimensional applications. For example, the structured data may comprise concrete data (e.g., data representing a tree or other structure and coded in C, C++, and/or one or more other programming languages), JSON data (e.g., in-memory JSON data or JSON data serialized to a file), data in a YAML file, protobuf data, XLM data, and/or one or more other types of structured data. In various implementations, the structured data may comprise a JSON part of a file used in a three-dimensional application. For example, the structured data may comprise a JSON part of a glTF and/or GLB file.

In various implementations, stream compression component 116 may be configured to compress structured data in the form of an intermediate symbol stream. The intermediate symbol stream may consist of symbols, as described herein. In various implementations, stream compression component 116 may be configured to obtain an intermediate symbol stream to be encoded. In various implementations, stream compression component 116 may be configured to compress the intermediate symbol stream using one or more entropy coding methods. For example, the one or more entropy coding methods may comprise Huffman coding, arithmetic coding, one of the asymmetric numeral systems (ANS) family of entropy coding methods, and/or one or more other entropy coding methods. As referred to herein, the ANS family of entropy coding methods may include range asymmetric numeral systems (rANS), tabled asymmetrical numeral systems (tANS), finite state entropy (FSE), and/or one or more other similar entropy coding methods. The compressed intermediate symbol stream may be referred to herein as a "compressed bitstream."

To obtain the intermediate symbol stream, stream compression component 116 may be configured to encode each structured data object (e.g., each JSON object) as a sequence of "(name, type, value)" triplets. As used herein, "serialize" and "serializing" may be used interchangeably with "encode" and "encoding," respectively, and "deserialize" and "deserializing" may be used interchangeably with "decode" and "decoding." In various implementations, the available types are pre-defined and, as such, may be encoded with pre-defined symbols. For example, a "type" in the sequence of "(name, type, value)" triplets may comprise one of an "object" type to represented nested objects, an "array" type to represent arrays, an "integer" type to represent integers, a "real" type to represent real or floating-point numbers, a "string" type to represent UNICODE strings, a "Boolean" type (e.g., with two values: true and false), and/or one or more other types. In some implementations, stream compression component 116 may be configured to parse a byte stream (such as a JSON file, a JSON chunk of GLB, and/or one or more other types of byte streams) into structured data before applying one or more compression methods, as described herein. For example, stream compression component 116 may be configured to parse a byte stream into a JSON representation as described herein (e.g., comprising assets, scenes, nodes, and/or other fields).

In various implementations, stream compression component 116 may be configured to encode an intermediate symbol stream obtained from structured data, using frequency tables (also known as "statistics" or "histograms"). Frequency tables are commonly used for entropy coding, however, using different frequency tables for the same symbol stream is at least not common. Encoding an intermediate symbol stream using different frequency tables may be referred to as "interleaving." In various implementations, the intermediate symbol stream may include bit chunks, consisting of one or more raw bits; bit chunks are typically emitted after certain symbols, as described herein. Interleaving and emitting raw bits may be implemented with Huffman coding, rANS, tANS, FSE, and arithmetic coding. For example, interleaving and emitting raw bits for arithmetic coding may be implemented, for example, using specially formatted "frames" to distinguish between different streams (e.g., a "raw bit" stream and each of per-frequency-table streams). When using Huffman coding, however, each intermediate stream symbol may take a whole number of bits-which means that both interleaving and emitting raw bits are trivial when using Huffman coding.

In some implementations, stream compression component 116 may be configured to embed frequency tables used to encode structured data into the resulting compressed bitstream. In other implementations, frequency tables used to encode structured data may not be embedded into the resulting compressed bitstream. Instead, frequency tables used to encode structured data may be embedded into a compressor and/or decompressor. In some implementations, frequency tables may themselves, derivatives of the frequency tables (e.g., Huffman trees, FSE decoding tables, and/or other frequency table derivatives) or even generated code needed to encode/decode a piece of data (such as name-type pair, integer, etc.) into/out-of an intermediate symbol and/or portion of bitstream may be embedded within compressor or decompressor. In various implementations, frequency tables used to encode structured data may be stored within electronic storage of system 100 that is accessible by stream compression component 116 when encoding the structured data and/or by stream decompression component 120 when decoding the compressed bitstream.

In various implementations, stream compression component 116 may be configured to determine the frequency table to use based on the type of intermediate stream symbol (which may also be interchangeably referred to herein simply as "symbol") being encoded. For example, based on the type of data object being encoded as a sequence of (name, type, value) triplets, stream compression component 116 may be configured to encode the object based on the corresponding frequency table generated by frequency table creation component 118.

Frequency table creation component 118 may be configured to generate one or more frequency tables to be used to encode structured data for rendering computer-generated graphics in three-dimensional applications. A frequency table is a table that displays the frequency of various outcomes in a sample. Each entry in the table may contain the frequency or a count of the occurrences of a given value within the sample. In various implementations, frequency table creation component 118 may be configured to generate frequency table(s) to be used to encode structured data with pre-defined symbols. In various implementations, frequency table creation component 118 may be configured to create frequency tables to be used to encode symbols within an intermediate symbol stream using all or a portion of the components of frequency table creation component 118 illustrated in FIG. 2.

FIG. 2 illustrates a block diagram of frequency table creation component 118 configured to create frequency tables to be used to encode symbols within an intermediate symbol stream, according to one or more aspects described herein. The various components of frequency table creation component 118 depict various sets of functions that may be implemented by computer program instructions of frequency table creation component 118. In various implementations, frequency table creation component 118 may include an object-type table component 202, an array-type table component 204, an integer-type table component 206, a real-type table component 208, a string-type table component 210, an enum value table component 212, a context dependent table component 214, and/or one or more other components. One or more of object-type table component 202, array-type table component 204, integer-type table component 206, real-type table component 208, string-type table component 210, enum value table component 212, and context dependent table component 214 may be coupled to one another or to components not shown in FIG. 2.

Object-type table component 202 may be configured to generate an object-type frequency table indicating a frequency of various objects in structured data. For example, object-type table component 202 may be configured to generate an object-type frequency table indicating a frequency of "(name, type)" pairs found in "(name, type, value)" triplets of an intermediate symbol stream. This object-type (or "name-type") frequency table may "predict" probable frequencies of "(name, type)" pairs for structured data objects being compressed. In some implementations, object-type table component 202 may be configured to generate an object-type frequency table using known information about the format being compressed. For example, object-type table component 202 may be configured to generate an object-type frequency table using known information about the specific JSON schema (including glTF JSON schema) being compressed. In some implementations, this known information (or other information) about or related to the structure of structured data (whether glTF or not) may be extracted from the respective JSON schemas. In some implementations, object-type table component 202 may be configured to generate an object-type frequency table based on statistics collected for all or a portion (i.e., a sample) of structured data to be compressed. In some implementations, the object-type frequency table described herein may be generated based on or by using a manual analysis of the structured data to be compressed or structured data similar to the structured data to be compressed. In various implementations, object-type table component 202 may be configured to include an entry in the object-type frequency table for miscellaneous (or other) objects found in the structured data. This miscellaneous entry in the object-type frequency table may be included and used to encode objects not otherwise found in the object-type frequency table. This miscellaneous entry in the object-type frequency table may be assigned an artificial frequency such that when objects not otherwise found in the table are encoded, a bit length for the corresponding symbol is limited to a pre-defined number of bits.

Array-type table component 204 may be configured to generate frequency tables to be used to encode arrays within structured data. In various implementations, array-type table component 204 may be configured to generate frequency table(s) indicating a frequency of array sizes within structured data and/or a frequency of different types of elements in arrays within structured data. For example, in various implementations, array-type table component 204 may be configured to generate at least an array size frequency table indicating a frequency of pre-defined ranges of array size within structured data and an element type frequency table indicating a frequency of different types of elements in an array. The array size frequency table may "predict" probable frequencies of pre-defined ranges of array sizes (i.e., how often arrays with size N are encountered), and the element type frequency table may "predict" probable frequencies of different elements in arrays within structured data (e.g., how often integers with value NN are encountered). In some implementations, array-type table component 204 may be configured to generate one or more frequency tables for filled arrays, RLE arrays, sparse arrays, and/or other types of arrays or encoding techniques. For example, array-type table component 204 may be configured to generate frequency tables indicating a frequency of frame types (e.g., a frame-type frequency table), frame sizes (e.g., a frame-size frequency table), and/or other RLE-array specific frequency tables. A frame-type frequency table may, for example, indicate a frequency of RLE frames, verbatim frames, and/or other types of frames utilized when encoding an RLE array.

Integer-type table component 206 may be configured to generate an integer-type frequency table indicating a frequency of various unsigned integers within structured data. For example, integer-type table component 206 may be configured to generate an integer-type frequency table indicating a frequency of pre-defined ranges of unsigned (or signed) integers within integer-type values in structured data. As such, this integer-type frequency table may "predict" probable frequencies of pre-defined ranges of unsigned integers within integer-type values. In a first example implementation, the pre-defined ranges may increase by a power of two. For example, a first range may represent only value "0", a second range may represent two values encodable with one additional bit (e.g., "1" and "2"), a third range may represent four values encodable with two additional bits (e.g., "3", "4", "5", and "6"), and so on. In a second example implementation, different ranges of a power of two may be used. For example, a first range may represent 128 different values (e.g., "0" to "127") encodable with seven additional bits, a second range may represent 16384 different values (e.g., "128" to "16512") encodable with fourteen (14) additional bits, and so on. In various implementations, the pre-defined ranges should cover the whole space of integers possible in a particular context. For example, with the first example implementation described above, all integers from "0" to "($2^{32}-2$)" may be represented using thirty-two (32) ranges. Note that such exponential growth of range size is not a strict requirement for ranges, and various range patterns may be used in the systems and methods described herein.

Real-type table component 208 may be configured to generate real-type frequency table(s) to be used to encode "real" (or floating-point) values within structured data. In various implementations, real-type table component 208 may be configured to generate two or more real-type frequency tables to be used to encode real (or floating-point) values within structured data. For example, real-type table component 208 may be configured to generate a decimal mantissa frequency table, a decimal exponent frequency table, a binary mantissa frequency table, a binary exponent frequency table, and/or one or more other real-type frequency tables. In fixed point notation, there are a fixed number of digits after the decimal point; whereas floating point notation allows for a varying number of digits after the decimal point. A floating-point representation of a number has two parts: the first part designates the significant digits of the number and may be referred to as the "mantissa"; and the second part designates the position of the decimal (or binary) point and may be referred to as the "exponent." Floating-point values may be represented as decimal floating-point numbers and/or as binary floating-point numbers. In various implementations, real-type table component 208 may be configured to generate real-type frequency tables to be used to encode real values as decimal floating-point numbers and/or as binary floating-point numbers.

In some implementations, real-type table component 208 may be configured to generate real-type frequency tables to be used to encode a real value as a decimal floating-point number. For example, encoding a real value as a decimal floating-point number may comprise encoding the real value as a mantissa integer and an exponent integer. For example, as a decimal floating-point number, the number "12345.678" may be encoded with the mantissa integer as "12345678" and the exponent integer as "−3." To facilitate such encoding, real-type table component 208 may be configured to generate at least a decimal mantissa frequency table and a decimal exponent frequency table. The decimal mantissa frequency table may indicate a frequency of integers occurring as mantissa for decimal floating-point numbers within structured data, and the decimal exponent frequency table may indicate a frequency of integers occurring as exponents for decimal floating-point numbers within structured data. In some implementations, real-type table component 208 may be configured to generate a decimal mantissa frequency table indicating a frequency of pre-defined ranges for integers occurring as mantissa for decimal floating-point numbers within structured data. This real-type frequency table may "predict" probable frequencies of pre-defined ranges of decimal mantissa within real-type values represented as decimal floating-point numbers. In some implementations, real-type table component 208 may be configured to generate a decimal exponent frequency table indicating a frequency of pre-defined ranges for integers occurring as exponents for decimal floating-point numbers within structured data. This real-type frequency table may "predict" probable frequencies of pre-defined ranges of decimal exponents within real-type values represented as decimal floating-point numbers.

In some implementations, real-type table component 208 may be configured to generate real-type frequency tables to be used to encode a real value as a binary floating-point number. For example, encoding a real value as a binary floating-point number may comprise encoding the real value as a mantissa integer and an exponent integer. For example, as a binary floating-point number, the number "0.75" may be encoded with the mantissa integer as "3" and the exponent integer as "−2." To facilitate such encoding, real-type table component 208 may be configured to generate at least a binary mantissa frequency table and a binary exponent frequency table. The binary mantissa frequency table may indicate a frequency of integers occurring as mantissa for binary floating-point numbers within structured data, and the binary exponent frequency table may indicate a frequency of integers occurring as exponents for binary floating-point numbers within structured data. In some implementations, real-type table component 208 may be configured to generate a binary mantissa frequency table indicating a frequency of pre-defined ranges for integers occurring as mantissa for binary floating-point numbers within structured data. This real-type frequency table may "predict" probable frequencies of pre-defined ranges of binary mantissa within real-type values represented as binary floating-point numbers. In some implementations, real-type table component 208 may be configured to generate a binary exponent frequency table indicating a frequency of pre-defined ranges for integers occurring as exponents for binary floating-point numbers within structured data. This real-type frequency table may "predict" probable frequencies of pre-defined ranges of binary exponents within real-type values represented as binary floating-point numbers.

The pre-defined ranges used for the decimal mantissa frequency table, the decimal exponent frequency table, the binary mantissa frequency table, and the binary exponent frequency table may be the same as or different than ranges appearing in an integer-type frequency table. For example, in some implementations, the pre-defined ranges used for a decimal mantissa frequency table and/or binary mantissa frequency table may be the same as the ranges used for an integer-type frequency table, and pre-defined ranges used for a decimal exponent frequency table and/or binary exponent frequency table may be different than the ranges used for the integer-type frequency table (and decimal/binary mantissa frequency table). In some implementations, the pre-defined ranges appearing in a decimal exponent frequency table or binary exponent frequency table may comprise ranges that do not require additional bits. For example, a first range ("range0") may correspond to a decimal exponent of "0", a second range ("range1") may correspond to a decimal exponent of "1", and so on. Accordingly, when encoded, the decimal or binary exponents may be encoded in a manner equivalent to encoding exponents directly with Huffman coding, arithmetic coding, or asymmetric numeral systems (ANS), without any additional bits emitted.

In some implementations, real-type table component 208 may be configured to generate a real-type frequency table to be used to encode real values within structured data as fixed-point values. To facilitate such encoding, real-type table component 208 may be configured to generate at least a fixed-point frequency table indicating a frequency of integers occurring as mantissa for fixed-point numbers within structured data. In some implementations, real-type table component 208 may be configured to generate a fixed-point frequency table indicating a frequency of pre-defined ranges for integers occurring as mantissa for fixed-point numbers within structured data. This real-type frequency table may "predict" probable frequencies of pre-defined ranges of mantissa within real-type values represented as fixed-point numbers. In some implementations, the fixed-point frequency table may be the same as or similar to decimal mantissa frequency table and/or binary mantissa frequency table. Note that unlike for decimal or binary floating-point numbers, fixed-point encodings may be implemented without having to encode exponent.

String-type table component 210 may be configured to generate string-type frequency tables to be used to encode strings within structured data. In various implementations, string-type table component 210 may be configured to generate string-type frequency table(s) indicating a frequency of string lengths within structured data and/or a frequency of characters within strings within structured data. For example, in various implementations, string-type table component 210 may be configured to generate a string length frequency table indicating a frequency of pre-defined ranges of string lengths within structured data and a string character frequency table indicating a frequency of characters appearing as strings within structured data. The string length frequency table may "predict" probable frequencies of pre-defined ranges of string lengths, and the string character frequency table may "predict" probable frequencies of different characters in strings within structured data.

Enum value table component 212 may be configured to generate an enum value frequency table to be used to encode miscellaneous data of one or more types within structured data. For example, an enum value may comprise a string or other value that has very few valid values when encoded as a "(name, type, value)" triplet. For example, according to the glTF 2.0 specification, the accessors.componentType field can only take values 5120, 5121, 5122, 5123, 5125, and 5126. Given this, these values may be encoded, not as integers, but as one of enum values, which may in turn improve compression. In various implementations, enum value table component 210 may be configured to generate an enum value frequency table indicating a frequency of pre-defined enum values within structured data. This enum value frequency table may "predict" probable frequencies of enum values within structured data being compressed.

Context dependent table component 214 may be configured to generate one or more context-dependent frequency tables. For example, context dependent table component 214 may be configured to generate, for one or more types of elements, items, objects, files, and/or applications, a set of frequency tables specific for that context (e.g., specific for that type of object or application). In various implementations, these context-dependent frequency tables may be implemented on top of a "last in, first out" (or "LIFO") stack, as described herein with respect to stream compression component 116. In an example implementation, a file being compressed may comprise a 3D model in a glTF file format comprising one or more structured data elements (e.g., JSON elements), such as "sampler", "source", "name", "extensions", and "extras." In this example implementation, context dependent table component 214 may be configured to generate a set of special frequency tables indicating a frequency of these elements within this and/or similar contexts. In some implementations, in addition to frequency tables for given elements, context dependent table component 214 may be configured to generate context-dependent frequency tables for frequencies of values for specific element. For example, if a certain element is using only values "0", "1", and "2", this may be reflected in a frequency table for that specific element. In some implementations, context dependent table component 214 may also be configured to generate context-dependent ranges (e.g., for encoding integers), context-dependent integer offsets, and/or context-dependent fixed-point positions, as similarly described herein.

In some implementations, context dependent table component 214 may be configured to generate one or more frequency tables for each and every type in a data structure. For example, context dependent table component 214 may be configured to generate frequency tables using information derived from the specific data structure (e.g., JSON schema) being compressed or from analysis of samples of existing data. In other implementations, context dependent table component 214 may be configured to generate one or more frequency tables for only a subset (i.e., less than all) of the types found in a data structure.

For example, whenever serializing a complex in-memory data structure, with structure X containing structure Y as its member, the operation may proceed as follows: X is serialized and "context X" is put on the LIFO stack—with frequency tables corresponding to the frequencies of occurrences within structure X. Then, members of structure X may be serialized (using frequency tables from the top of the LIFO stack). Then, when serializing of structure Y (a member of structure X), another context (context Y) may be put to the LIFO stack—containing frequency tables representative for structure Y. Then, when serializing members of structure Y, top of the LIFO stack may be "context Y", so serializing members of structure Y may use these frequency tables from "context Y". When done with serializing structure Y, its context may be removed from the LIFO stack, so topmost item there will become "context X" now, and resume serializing remaining members of structure X. This may ensure using more appropriate frequency tables for the same data types in different contexts, which may improve compression ratio.

In some implementations, context dependent table component 214 may be configured to generate, manage, and update contexts to be used when encoding structured data. For example, in various implementations, context dependent table component 214 may be configured to organize contexts to be used when encoding structured data into a hierarchy. In various implementations, context dependent table component 214 may be configured to organize contexts to be used when encoding structured data into a hierarchy based on the hierarchy of the structured data itself (e.g., based on the hierarchy of the JSON data structure, or, as in the serialization example above, in-memory data structure).

In an example implementation, structured data to be compressed (e.g., glTF JSON, which may follow some of the rules specified in "glTF™ 2.0 Specification", available from https://registry.khronos.org/glTF/specs/2.0/glTF-2.0.html) may comprise fields arranged in the following hierarchy: "asset" field; "scene" field, "nodes" field, and/or one or more other fields. In this "root element context" example implementation, context dependent table component 214 may be configured to generate one or more frequency tables for each of these fields with the same hierarchy. For example, context dependent table component 214 may be configured to generate a frequency table similar to the object-type frequency table described herein with respect to object-type table component 202 with values corresponding to the "asset" field, "scene" field, "nodes" field, and/or one or more other fields.

With respect to the "asset" field(s), context dependent table component 214 may also be configured to generate one or more frequency tables. For example, context dependent table component 214 may be configured to generate a frequency table similar to the object-type frequency table described herein with respect to object-type table component 202 with values corresponding to a "generator" field, a "version" field, and/or one or more other fields. String-type fields may be typical for both "generator" fields and "version" fields. As such, in some implementations, frequency tables similar to the string-type frequency tables described herein with respect to string-type table component 210 may also be generated for the "generator" field and/or the "version" field.

With respect to the "scene" field, context dependent table component 214 may also be configured to generate one or more frequency tables. For example, integer-type fields may be typical for "scene" fields. As such, in some implementations, frequency tables similar to the integer-type frequency table described herein with respect to integer-type table component 206 may be generated for the "scene" field.

With respect to the "nodes" field, context dependent table component 214 may also be configured to generate one or more frequency tables. For example, array-type fields may be typical for "nodes" fields. As such, in some implementations, frequency tables similar to the array-type frequency tables described herein with respect to array-type table component 204 may be generated for the "nodes" field. For example, context dependent table component 214 may be configured to generate frequency table(s) indicating a frequency of array sizes within the "nodes" field and a frequency of different types of elements in the "nodes" field. In some implementations, the "nodes" field may have its own context. For example, one or more frequency tables may be generated for different elements or items in the "nodes" field array. In the example implementation, the "nodes" field array may have a "children" field, a "matrix" field, and/or one or more other fields. The "children" field, the "matrix" field, and/or one or more other fields found in the "nodes" field array may each have their own frequency tables, including frequency tables for items found within their own arrays.

Referring back to FIG. 1, stream compression component 116 may be configured to encode an object based on at least one frequency table generated by frequency table creation component 118, as described herein. In some implementations, frequency tables may be generated (or created) before encoding or decoding structured data. Accordingly, in some implementations, frequency table creation may not be part of the encoding or decoding of the structured data.

When encoding a field of a structured data object, stream compression component 116 may be configured to determine whether the object's "(name, type)" pair is listed in an object-type frequency table. If the object's "(name, type)" pair is listed in the object-type frequency table, stream compression component 116 may be configured to use a corresponding symbol from the object-type frequency table when encoding that object. If the object's "(name, type)" pair is not listed in the object-type frequency table, stream compression component 116 may be configured to use a symbol associated with an entry for miscellaneous (or other) objects, followed by a string representing a field name, followed by raw bits which represent a type for the object. In some implementations, the string representing the field name may be encoded using either a string-type frequency table (as described herein), a special "name" frequency table, or a fixed encoding such as UTF-8, UTF-16, or other variable similar form of character encoding.

In some implementations, an object-type frequency table may comprise only a "name" instead of a "(name, type)" pair. In this case, stream compression component 116 may be configured to encode "type" by emitting a fixed number of bits or by using a separate frequency table for types.

When encoding arrays within structured data, stream compression component 116 may be configured to use an array size frequency table and an element type frequency table. In various implementations, stream compression component 116 may be configured to use an array size frequency table and an element-type frequency table to encode same-type arrays and/or variable-type arrays. In some implementations, stream compression component 116 may be configured to use an array size frequency table and an element type frequency table to encode (and distinguish between) both same-type arrays and variable-type arrays. A same-type array is an array made up of one type of element; whereas a variable-type array is made up of elements of different types. When encoding a same-type array value, stream compression component 116 may be configured to identify a corresponding range for the array size within an array size frequency table, emit the symbol associated with the identified array size range followed by raw bits denoting a position of the array size within the range, and then encode each element in the array as described herein based on the type of the element. When encoding a variable-type array value, stream compression component 116 may be configured to identify a corresponding range for the array size within an array size frequency table, emit the symbol associated with the identified array size range followed by raw bits denoting a position of the array size within the range, and then encode each element in the array with a pair indicating the type of element and value for the element. In various implementations, stream compression component 116 may be configured to identify a symbol for the element type using an element type frequency table and encode the type of element in the pair based on the identified symbol.

In some implementations, when encoding an array, stream compression component 116 may be configured to emit a single raw bit indicating whether the array comprises a single-type array or a variable-type array. For example, stream compression component 116 may be configured to emit a single raw bit indicating whether the array comprises a single-type array or a variable-type array that precedes any other information specific to individual array elements. In other implementations, when encoding an array, stream compression component 116 may be configured to encode this information (i.e., whether the array comprises a single-type array or a variable-type array) by incorporating this information into the "(name, type)" pair instead of in raw bits. For example, in some implementations, an object-type frequency table described herein may have two symbols for each "array" type-one for same-type arrays and one for variable-type arrays. When encoding the array, stream compression component 116 may be configured to use the appropriate symbol from the object-type frequency table depending on whether the array comprises a single-type array or a variable-type array.

In various implementations, stream compression component 116 may also be configured to encode arrays within structured data as filled arrays, RLE arrays, and/or sparse arrays. In some implementations, stream compression component 116 may be configured to encode arrays within structured data as filled arrays, run length encoding (RLE) arrays, and/or sparse arrays instead of encoding arrays as same-type arrays or variable-type arrays.

A filled array may comprise an array with all items in the array having the same value. In various implementations, stream compression component 116 may be configured to encode a filled array based on array size and one single value (i.e., the value shared amongst the items). As described above with respect to same-type and variable-type array, encoding the size of the filled array may comprise identifying a corresponding range for the array size within an array size frequency table, and emitting the symbol associated with the identified array size range followed by raw bits denoting a position of the array size within the range.

An RLE array (or an RLE-encoded array) may use RLE and RLE-like encodings. In one example, it may be encoded using "frames"; in this case, only "frames" may be present in the encoded array. One of the "frames" may be a "verbatim frame", which may contain size, and individual symbols, which are copied as is ("verbatim") to the array; first frame of an array is often verbatim one. Another type of frame may be "RLE frame"—in which case only number N may be encoded, indicating how many times last value already encoded ("already in the array" when being decoded) should be repeated. Another example of an RLE-like frame is a frame which is referred to herein as an "LZ77-like" frame with semantics of "take last X elements starting from the element Y positions back from current position in array", with only values X and Y encoded.

In various implementations, RLE arrays may be encoded with frames. Each frame may comprise either an RLE frame or a verbatim frame. Each frame in an RLE array may be encoded based on at least frame type (e.g., using an RLE array-specific frequency table) and frame size of the array. To encode the frame type, stream compression component 116 may be configured to identify the type of frame in a frame-type frequency table indicating a frequency of different frame types and emit a corresponding symbol to indicate the frame type (e.g., RLE or verbatim). In various implementations, stream compression component 116 may be configured to encode frame size using a technique similar to the technique for encoding array size. For example, to encode the frame size, stream compression component 116 may be configured to identify a corresponding range for the frame size within a frame-size frequency table and emit the symbol associated with the identified frame size range followed by raw bits denoting a position of the frame size within the range. When encoding verbatim frames, stream compression component 116 may be configured to encode N array elements in one verbatim frame; encoded verbatim frame may comprise number N encoded, followed by N array values; these values may be intended to be used "as is" ("verbatim") as a part of the decoded array when decoded. When encoding RLE frames, stream compression component 116 may be configured to repeat last value of the already-encoded part of the array N times; in this case, only number N may be encoded.

In some implementations, RLE arrays comprising integer-type elements may include incremental frames. When encoding such RLE arrays, stream compression component 116 may be configured to encode frame size and a single starting value. When decoded, stream decompression component 120 may be configured to decode the array as a sequence of frames of that size beginning at the starting value, and with each subsequent decoded array element within that frame size decoded as the next frame in the array (e.g., as the previous element plus one). In a similar manner, stream compression component 116 may be configured to encode RLE arrays using decremental frames, which are decoded as a previous element minus one.

In some implementations, RLE arrays comprising integer-type or real-type elements may include differential frames. To encode a differential frame, stream compression component 116 may be configured to encode frame size and a single starting value, then frame size values may be encoded with each specifying a difference from the previous value. In some implementations, RLE arrays may include frames referred to herein as "LZ77-like" frames, which refer back to the previous sequence of elements by using "distance" and "size." Upon encountering an LZ77-like frame, a decoder (e.g., stream decompression component 120) may be configured to copy a number of array elements based on the encoded array size starting from a current position minus the encoded difference. In some implementations, LZ77-like frames may have "size>distance", which may be interpreted as element-by-element copying of size elements. For example, in such implementations, LZ77-like frames with a distance value of "1" may be used in lieu of RLE frames. In some implementations, stream compression component 116 may be configured to encode LZ77-difference frames, which may include a back reference to previous array elements but are still encoded with an indication of a distance from one or more previous array elements.

In some implementations, stream compression component 116 may be configured to incorporate one or more modifiers into an encoded frame type if all the items within a frame have the same modifier. As described herein, to incorporate information (or modifiers) into a "(name, type)" pair instead of in raw bits may comprise using an object-type frequency table described herein having multiple symbols for each type that correspond to different modifiers. For example, a frame-type frequency table as described herein may have two or more symbols for each frame type indicating, for example, that the frame is signed or unsigned, in a specific integer range, multiplied or divided by a specific value, and/or other information. When encoding the frame type, stream compression component 116 may be configured to use the appropriate symbol from the frame-type frequency table to indicate whether the frame is signed or unsigned, in a specific integer range, multiplied or divided by a specific value, and/or otherwise indicate information incorporated via the frame-type frequency table.

In some implementations, sparse arrays may be used. Sparse arrays are similar to RLE arrays, but have one default value for all RLE frames that is specified before any frame. As such, a sparse array may use another type of frame (in addition to RLE frames discussed above), a "skip frame", which just specifies N—number of elements to skip; in such cases, stream compression component 116 may be configured to use the default value for all skipped elements. Also, the total length of the elements in the frames of the sparse array may be less than the length of the array itself; in such cases, remaining elements of the sparse array may be filled with the default value too. In some embodiments, it may allow encoding of the whole sparse-array without any frames, which will cause the whole array to have the same default value.

In some implementations, when encoding an array, stream compression component 116 may be configured to encode an indication of the array type (e.g., single-type array, variable type array, filled array, RLE array, or sparse array) by incorporating this information into the "(name, type)" pair. For example, in some implementations, an object-type frequency table described herein may have multiple symbols for each "array" type-one for each array type possibly appearing in the intermediate symbol stream. When encoding the array, stream compression component 116 may be configured to use the appropriate symbol from the object-type frequency table depending on the type of array.

In some implementations, it may be known that the order of elements for a certain array does not make any semantic difference for the receiving side of the communication. In other words, the array is essentially not an ordered "sequence", but rather an unordered "set". In such cases, stream compression component 116 may be configured to reorder array elements to achieve better compression. For example, stream compression component 116 may be configured to reorder elements so that an order of the array elements (or a certain field in the array elements) is monotonous, so that differential encodings work more efficiently. In some implementations, stream compression component 116 may also be configured to reorder fields within a structured data object for the same purpose. This may be done without any a prior knowledge or information about the structured data being compressed.

When encoding integer values for structured data objects, stream compression component 116 may be configured to identify a corresponding range for the integer within an integer-type frequency table and encode the integer value using the symbol associated with the identified range followed by raw bits denoting a position of the integer value within the range. In some implementations, an "offset" for integers may be incorporated into an intermediate symbol stream or embedded into a compressor (or stream compression component 116) or decompressor (or stream decompression component 120) used to compress or decompress the intermediate symbol stream. For example, in some implementations, certain fields (such as timestamps) may include inherently skewed values. In such implementations, stream compression component 116 may be configured to use the integer offset to compress such fields with inherently skewed values.

In some implementations, when encoding signed integers, stream compression component 116 may be configured to encode the signed integer with an additional raw "sign" bit. In other implementations, when encoding signed integers, stream compression component 116 may be configured to encode this information (i.e., whether the integer value is signed) by incorporating this information into the "(name, type)" pair instead of in raw bits. For example, in some implementations, an object-type frequency table described herein may have two symbols for each "integer" type-one for unsigned integers and one for signed integers. When encoding the integer, stream compression component 116 may be configured to use the appropriate symbol from the object-type frequency table depending on whether the integer value is signed. In some implementations, stream compression component 116 may be configured to use zig-zag encoding to convert signed integers into an unsigned integer before encoding based on its range in an integer-type frequency table.

In some implementations, stream compression component 116 may similarly be configured to incorporate information about the range of a specific value into a "(name, type)" pair in a similar manner. For example, in some implementations, the object-type frequency table described herein may have different symbols for each "integer" type that indicate range information. When encoding the integer, stream compression component 116 may be configured to use the appropriate symbol from the object-type frequency table depending on the range information for that integer.

In some implementations, when encoding integer values, stream compression component 116 may be configured to multiply or divide an integer value by a pre-defined value before encoding. For example, stream compression component 116 may be configured to multiply or divide a given integer value by a pre-defined value before encoding if it is known that the integer value has to be a multiple of a specific value (i.e., the pre-defined value). In some implementations, such knowledge (i.e., that the integer value has to be a multiple of a specific value) may comprise known information about or related to the structured data being compressed. For example, an integer value being encoded may be a "byteOffset" field for a glTF accessor that must be a multiple of the size of the accessor's component type. In some implementations, knowledge that an integer value has to be a multiple of a specific value may be derived from statistical analysis. In some implementations, stream compression component 116 may be configured to include an indication of whether or not an encoded value is multiplied or divided by a specific value. For example, in some implementations, stream compression component 116 may be configured to incorporate an indication that an encoded value is (or is not) multiplied or divided by a value prior to encoding into a "(name, type)." In some implementations, stream compression component 116 may be configured to incorporate an indication that an encoded value is (or is not) multiplied by a value prior to encoding into a "(name, type)" pair in a manner similar to how information indicating whether an integer value is signed may be incorporated into a "(name, type)" pair. For example, in some implementations, an object-type frequency table described herein may have two symbols for each "integer" type—one for integers that are a multiple of a pre-defined value and one for integers that are not a multiple of a pre-defined value. When encoding the integer, stream compression component 116 may be configured to use the appropriate symbol from the object-type frequency table depending on whether the integer value is a multiple of the pre-defined value.

When encoding real values for structured data objects, stream compression component 116 may be configured to encode the real values as decimal floating-point numbers and/or as binary floating-point numbers. For example, stream compression component 116 may be configured to encode a real value as "(decimal_mantissa, decimal_exponent)" or as "(binary_mantissa, binary_exponent)." To encode a real value in the form of decimal floating-point number, stream compression component 116 may be configured to identify a corresponding range for the mantissa integer within a decimal mantissa frequency table, encode the mantissa integer using the symbol associated with the identified range followed by raw bits denoting a position of the mantissa integer within the range, identify a corresponding range for the exponent integer within a decimal exponent frequency table, and encode the exponent integer using the symbol associated with the identified range followed by raw bits denoting a position of the exponent integer within the range. To encode a real value in the form of binary floating-point number, stream compression component 116 may be configured to identify a corresponding range for the mantissa integer within a binary mantissa frequency table, encode the mantissa integer using the symbol associated with the identified range followed by raw bits denoting a position of the mantissa integer within the range, identify a corresponding range for the exponent integer within a binary exponent frequency table, and encode the exponent integer using the symbol associated with the identified range followed by raw bits denoting a position of the exponent integer within the range. In some implementations, an "offset" specifically for the mantissa integer and/or the exponent integer may be incorporated into an intermediate symbol stream or embedded into a compressor or decompressor used to compress or decompress the intermediate symbol stream, as described herein.

In some implementations, stream compression component 116 may be configured to encode real values within structured data as fixed-point numbers. To encode a real value in the form of a fixed-point number, stream compression component 116 may be configured to identify a corresponding range for the mantissa integer of the fixed-point number in the fixed-point frequency table and encode the mantissa integer using the symbol associated with the identified range followed by raw bits denoting a position of the mantissa integer within the range. In some implementations, rather than encoding the exponent for the fixed-point representation, the exponent may be embedded into a compressor or decompressor used to compress or decompress the intermediate symbol stream, as described herein. Accordingly, in some implementations, only the mantissa integer and not the exponent integer may be encoded when encoding real values within structured data as fixed-point numbers.

In some implementations, stream compression component 116 may be configured to encode real values of structured data objects using more than one representation. In other words, stream compression component 116 may be configured to encode different real values for structured data objects in an intermediate symbol stream using different numerical representations. For example, stream compression component 116 may be configured to encode real values within structured data as decimal floating-point numbers, as binary floating-point numbers, and/or as fixed-point numbers. In some implementations, stream compression component 116 may be configured to select a numerical representation to encode for a given real value. For example, stream compression component 116 may be configured to determine a size of each numerical representation (i.e., decimal, binary, and fixed point) for a given real value and select the numerical representation to use when encoding the real value based on which numerical representation is the smallest (i.e., uses the fewest number of bits) for that real value. In some implementations, stream compression component 116 may be configured to encode real values of structured data objects using more than one fixed-point representation. For example, stream compression component 116 may be configured to encode different real values of different structured data objects in an intermediate symbol stream using fixed-point representations with different positions for the fixed point.

In some implementations, when utilizing multiple representations to encode real values of structured data objects in an intermediate symbol stream, stream compression component 116 may be configured to incorporate additional raw bits to specify which numerical representation (e.g., decimal, binary, or fixed-point) is to be used when decoding. In other implementations, stream compression component 116 may be configured to incorporate an indication of which numerical representation is to be used when decoding into a "(name, type)" pair in a manner similar to how information indicating whether an integer value is signed may be incorporated into a "(name, type)" pair. For example, in some implementations, an object-type frequency table described herein may have separate symbols for the different numerical representations used for each "real" type. For example, for each "real" type, the object-type frequency table may have at least a first symbol for real values encoded using a first numerical representation and a second symbol for real values encoded using a second numerical representation. When encoding the real value, stream compression component 116 may be configured to use the appropriate symbol from the object-type frequency table depending on the numerical representation to be used when encoding the real value.

In some implementations, when encoding "integer" or "real" fields for structured data objects, stream compression component 116 may be configured to encode a difference from a previous value. If differences are small, this may result in smaller values that may be encoded with fewer bits. In some implementations, stream compression component 116 may be configured to encode a difference from a last field of the same type encountered in the already-encoded stream. In some implementations, stream compression component 116 may be configured to encode a difference from a last field with the same "(name, type)" pair in the already-encoded stream. In some implementations, stream compression component 116 may be configured to encode a difference from a last field in the same array. In some implementations, stream compression component 116 may be configured to encode a difference from a second-to-last (third-to-last, etc.) instead of last in any of previous differences. In some implementations, if contexts are used (as described herein), stream compression component 116 may be configured to refer to a last field in the already-encoded stream with the same "(name, type)" pair in the same context. In other implementations, stream compression component 116 may be configured to encode a reference to any other already-encoded value of the same type.

When encoding a string value within structured data (e.g., into an intermediate symbol stream), stream compression component 116 may be configured to use a string length frequency table and a string character frequency table. In various implementations, stream compression component 116 may be configured to identify a corresponding range for the string length within a string length type frequency table, identify a symbol for the character appearing in the string using a string character frequency table, and encode the string as a string comprising the symbol identified for the character in the string character frequency table repeated a number of times corresponding to the identified range within the string length frequency table.

When encoding Boolean values (i.e., "true" or "false") within structured data, stream compression component 116 may be configured to emit a single raw bit (e.g., "1" or "0") indicating its value. In some implementations, instead of encoding a Boolean value as a raw bit, stream compression component 116 may be configured to incorporate this information into the "(name, type)" pair. For example, in some implementations, an object-type frequency table described herein may have two symbols for each "Boolean" type-one for Boolean values that are "true" and another for Boolean values that are "false." When encoding the Boolean value, stream compression component 116 may be configured to use the appropriate symbol from the object-type frequency table depending on whether the Boolean value is "true" or "false." This may be especially useful when used in conjunction with non-Huffman entropy codings (such as rANS/tANS or arithmetic coding).

When encoding enum values within structured data, stream compression component 116 may be configured to identify a symbol corresponding to the enum value in an enum value frequency table and use the identified symbol to encode the enum value. In some implementations, instead of encoding an enum value using an enum value frequency table, stream compression component 116 may be configured to incorporate information identifying the enum value into "(name, type)" pair. For example, in some implementations, an object-type frequency table described herein may have symbols for each object that may include the enum value in its "(name, type, value)" triplet. When encoding the object, stream compression component 116 may be configured to use the appropriate symbol from the object-type frequency table to indicate the value for the object is the enum value.

In various implementations, stream compression component 116 may be configured to encode an intermediate symbol stream using context-dependent frequency tables. In various implementations, stream compression component 116 may be configured to utilize a different set of frequency tables depending on the type of data being compressed. For example, if a file being compressed is a 3D model in a glTF file format, the file may comprise one or more structured data elements (e.g., JSON elements), such as "sampler", "source", "name", "extensions", and "extras." In this example implementation, stream compression component 116 may be configured to utilize one or more special frequency tables (or context-dependent frequency tables) to compress the 3D model. For example, stream compression component 116 may be configured to utilize one or more context-dependent frequency tables described herein with respect to context dependent table component 214. In some implementations, some or all of the encoding techniques described herein may be context-dependent.

In various implementations, context-dependent frequency tables may be implemented on top of a LIFO stack. For example, in various implementations, a set of frequency tables may be associated with a given "context." A "context" may refer to a given encoding situation, such as when a specific element, item, object, file, and/or application is being encoded. In some embodiments, the contexts may be hierarchical—for example, if a file contains a container, which contains a data structure, which contains another data structure—then each (i.e., the file, container, data structure, another data structure, etc.) may have its own context, and moreover, when encoding/decoding (serializing/deserializing) of each of these entities is completed, implementation may be configured to use the context from the previously-handled entity, effectively resuming using the context for this previously-handled entity. As described herein with respect to context dependent table component 214, a set of frequency tables may be generated for a given context and accessed when encoding or decoding with respect to that context. When encoding an intermediate symbol stream, stream compression component 116 may be configured to include an indication of a context. For example, stream compression component 116 may be configured to push onto a LIFO stack an item indicating a specific context prior to encoding an object or element using that context. In some implementations, this item may indicate a change from one context to another. Accordingly, an item indicating a context (which item may contain, for example, a pointer or reference to the respective frequency tables), may be pushed onto a stack and popped from the stack when an end of the corresponding object or array is encountered. Depending on the implementation, a LIFO stack referred to herein may be implemented on top of a CPU stack (e.g., pushing values to CPU stack in a recursive program) or on top of a separate stack data structure.

In various implementations, stream compression component 116 may be configured to encode structured data with contexts switching automatically based on a current position of the data being parsed in the data structure. In some implementations, stream compression component 116 may be configured to place an explicit marker into the encoded intermediate stream to switch from one context to another. For example, stream compression component 116 may be configured to encode the marker as a special symbol which may be artificially added to one or more frequency tables the same as or similar to the object-type frequency table described herein with respect to object-type table component 202. In some implementations, for certain arrays, stream compression component 116 may be configured to encode an intermediate symbol stream to additionally switch contexts automatically depending on the last value of the array. This may be especially applicable in implementations in which the structured data being encoded and compressed comprises executable code, as described herein.

In various implementations, stream compression component 116 may be configured to encode nullable and non-nullable fields. By default, all fields in some structured data (for example, in JSON) may be nullable fields. In some implementations, known information about the structured data (e.g., from an appropriate JSON schema, or from the data structures being serialized) may be used to indicate that a field is non nullable. In various implementations, stream compression component 116 may be configured to encode non-nullable fields as described herein. To encode nullable fields, stream compression component 116 may be configured to emit a single raw bit indicating whether a field has "null" value. For example, stream compression component 116 may be configured to emit a single raw bit of "1" to indicate when decoding that the value is null. If the bit is "0", the subsequent bit may be decoded as described herein. In other implementations, stream compression component 116 may be configured to encode this information (i.e., whether a field has a null value) by incorporating this information into the "(name, type)" pair instead of in raw bits. For example, in some implementations, an object-type frequency table described herein may have two symbols for each object type-one for objects with null value and one for objects with values encoded as described herein.

In some implementations, it may be known that a certain field has a specific default value. For example, in some implementations, if a field is not present for a given element, stream compression component 116 may be configured to interpret the field as having a default value. When it is known that a certain field has a specific default value and that field is encountered with that default value, stream compression component 116 may be configured to skip encoding that field altogether. In some implementations, it may be known that a certain field frequently has a given value. In such implementations, stream compression component 116 may be configured to skip encoding that field if it has that common value. If that field has a different value, stream compression component 116 may be configured to encode the field as described herein. If the field is not present, stream compression component 116 may be configured to encode the field with a special "(name, not-present)" symbol.

In some implementations, it may be known that certain fields are mandatory. In such implementations, stream compression component 116 may be configured to avoid encoding altogether "(name, type)" pairs of "(name, type, value)" triplets, and instead encode only their respective values. For such mandatory fields, stream compression component 116 may be configured to maintain a same order of values as stream decompression component 120. The exact order may not be relevant so long as the same order is maintained by both compressing and decompressing side. For example, the values may be sorted by name—or by the order of the fields in the data structure being serialized/deserialized. In some implementations, if it is known that certain fields are frequently encountered (and/or are pre-defined), stream compression component 116 may be configured to avoid issuing a "(name, type)" pair (or symbol) for those fields and instead encode them via one single raw bit indicating whether or not the field is present (e.g., "field present" or "field not present"). If the field is present, stream compression component 116 may be configured to also include a value of the respective type.

In some implementations, stream compression component 116 may be configured to identify typical data objects. When encoding such objects, stream compression component 116 may be configured to emit a single raw bit to identify whether this particular instance is "typical." Then, if it is "typical," stream compression component 116 may be configured to encode the fields as a "typical" data object without issuing a "(name, type)" pair or symbol (i.e., by just encoding their values), and encode the rest of the fields (and/or any changes compared to the "typical" field) using the methods described herein. And if an object is not "typical," stream compression component 116 may be configured to encode each field using the methods described herein. Effectively, two separate "encoding patterns" may be used for a single type: one "typical" and one "generic." In some implementations, such "encoding patterns" may include not only implied "(name, type)" pairs or symbols, but also implied values of one or more fields.

In some implementations, there may be more than one pattern present for the same "typical data object." In some implementations, stream compression component 116 may be configured to emit a symbol or single raw bit indicating which encoding pattern is used to encode a particular object. In some instances, however, more than one bit may be required to identify which encoding pattern applies to this specific instance. In such implementations, stream compression component 116 may be configured to encode this information (i.e., which encoding pattern was used) by incorporating this information into the "(name, type)" pair instead of in raw bits. For example, in some implementations, an object-type frequency table described herein may have two symbols for each type-one for a first encoding pattern and another for a second encoding pattern. When encoding the object, stream compression component 116 may be configured to use the appropriate symbol from the object-type frequency table depending on which encoding pattern was used. In some implementations, the encoding patterns used for objects of a certain type may be context-dependent.

In some implementations, stream compression component 116 may be configured to encode an object as being a "typical" object (as described herein), but may additionally specify an "override" for it. For example, if a "typical" object has implied values for five fields, but an object being encoded has four fields having the same values as those for a "typical" object, with a fifth one being different. In such an instance, stream compression component 116 may be configured to encode the object as a "typical" object, but may specify a fifth value using the "(name, type, value)" triplet described herein and indicate that the fifth value "overrides" the value specified in the "typical" object.

In some implementations, stream compression component 116 may be configured to "override" default "frequency tables" (and/or other data which belongs to contexts) within the stream itself. For example, in some implementations, these "overriding" frequency tables (or their derivatives) may be encoded using existing methods (such as those used to encode Huffman tables in ZLIB and/or those used to encode Huffman trees and/or FSE tables in ZSTD). In some implementations, "overriding" a default "frequency table" may add new symbols to the table. In some implementations, all "overriding" "frequency tables" may belong to a single section in the beginning of the stream.

As described herein, encoding patterns for "typical" objects may be embedded within both a compressor (or in storage associated with stream compression component 116) and a decompressor (or in storage associated with stream decompression component 120). In some implementations, however, stream compression component 116 may be configured to incorporate an indication specifying encoding patterns for "typical" objects right within the bitstream. In some implementations, stream compression component 116 may be configured to serialize a new "typical" encoding-pattern within the stream itself and specify how it should be encoded when encountered. For example, stream compression component 116 may be configured to specify that a "typical" object will follow. Then, stream compression component 116 may be configured to specify a newly created type-ID of the "typical object" along with mandatory nametype pairs (and, optionally, values for the new "typical" encoding pattern). To enable use of the pattern within the stream, stream compression component 116 may be configured to "override" one or more "frequency tables" in the manner described herein so as to add new symbol(s) which correspond to the "typical" encoding pattern (i.e., specifying that new symbol(s) correspond to a specific type-ID when encountered).

In some implementations, stream compression component 116 may be configured to round values in real value fields to limit the precision of the value stored within the field. For example, in some implementations, stream compression component 116 may be configured to apply quantization (if necessary) to limit the precision of values stored within real value fields. In some implementations, stream compression component 116 may be configured to apply rounding (or quantization) based on an active context. In other words, rounding a number to limit precision of values stored (e.g., by applying quantization) may be context-dependent. In some implementations, rounding of different fields may affect certain final result. For example, in glTF, nodes are hierarchical, and transformations apply to the meshes within the nodes in hierarchical manner. As such, final coordinates of mesh vertices may be affected by several subsequent transformations. In such instances, stream compression component 116 may be configured to choose rounding (or quantization) for the next field so as to prevent rounding errors from accumulating. For example, stream compression component 116 may be configured to round a first transformation using pre-defined rounding rules. For a second transformation (which is applied after the first transformation), stream compression component 116 may be configured to take all possible roundings (e.g., rounding up and rounding down each parameter) and make a n-dimensional "cube" out of the possible roundings (with two possible values-"rounding up" and "rounding down"—for each dimension). For example, if the transformation is a "rotation," there may be three parameters. As such, stream compression component 116 may be configured to analyze eight potential roundings (i.e., $2^3=8$). For each potential roundings, stream compression component 116 may be configured to analyze how applying both first-rounded and second-rounded transformation affects final result (of both transformations taken together) and compare it with the result of applying both first-not-rounded and second-not-rounded transformation. For each of these roundings, stream compression component 116 may be configured to calculate how far the end result of the rounded transformation pair is from the not-rounded transformation pair using some metric, and use this metric as a criteria for choosing the rounding (out of the possible roundings) to be used for encoding. For the rotation example introduced above, stream compression component 116 may be configured to use an angle between resulting rotation vectors (e.g., after two rounded transformations and after two not-rounded transformations) as the metric, or may use a square mean error (or square of distances) of mesh vertices after applying two rounded transformations and after applying two not-rounded transformations as such a metric and/or criteria.

In some implementations, stream compression component 116 may be configured to change encoding of a certain field or set of fields into an equivalent (and/or rounded) form. For example, when encoding glTF JSON, stream compression component 116 may be configured to convert each "matrix" field into a set of "translation", "rotation", "scale" (TRS) fields (or vice versa). In some of such implementations, stream compression component 116 may be configured to avoid special handling of changed fields on decompression side. For example, when compressing glTF, it may be possible because glTF supports both "matrix" and "TRS" representations for some of its fields. In an another example implementation, stream compression component 116 may be configured to encode a "rotation" field using a non-redundant representation such as a set of Euler angles, Tait-Bryan angles, or using half-angle transform, harmonic mean, Cayley transform, exponential map. In some implementations, stream decompression component 120 may be configured to use inverse transform to convert the converted "rotation" field back to quaternion-based "rotation" representation on decompression. This may be beneficial, for example, as non-redundant representations may be more resilient to rounding/quantization, and/or because of better compression of such non-redundant representations. In some implementations, stream decompression component 120 may be configured to use "smallest-three" quantization of the quaternion. In some embodiments, especially if quantization (or rounding) was used to encode rotation represented as a quaternion, stream decompression component 120 may be configured to normalize quaternion as a part of decoding.

As described herein, in some implementations, stream compression component 116 may be configured to encode "integer" or "real" fields as a difference from a previous value. Information indicating that a difference is used for encoding a particular value and/or to what the difference relates (e.g., from last field of the same type, from last field with the same "(name, type)" pair, etc.) may be encoded as raw bits, or may be "incorporated" into the "(name, type)" pair as described herein. In some implementations, when encoding a difference from a "second-to-last" ("third-to-last", etc.), stream compression component 116 may be configured to encode reference to the previous field via a special symbol followed by the encoded distance (e.g., "1" for "last", "2" for "second-to-last", and so on), so the whole value encoded as this special symbol, followed by distance, and by the difference from the item denoted by distance. In such implementations, stream compression component 116 may be configured to encode the difference and/or distance as yet another integer, which may have its own frequency tables and/or integer ranges similar to the frequency tables and/or integer ranges described herein.

In some implementations, the concept of "difference" encoding may be extended to a "prediction function" that uses previously-encoded values to "predict" the next value. Then, stream compression component 116 may be configured to encode only a difference from the predicted-next-value. In some implementations (in particular, when encoding BIN glTF data), stream compression component 116 may be configured to use some variation of an Edgebreaker algorithm and/or parallelogram prediction as the "prediction function." In other implementations, stream compression component 116 may be configured to use it in a manner similar to that of the Draco compression method.

In some implementations, the concept of "difference" encoding may be extended to differences between whole objects. In such cases, stream compression component 116 may be configured to encode a difference from some previously-encountered instance of the same object type by simply encoding only a set of fields which are different between objects. In some implementations, stream compression component 116 may be configured to encode fields of such differentially-encoded objects as differences themselves. For example, when encoding an object "as a difference", stream compression component 116 may be configured to encode an integer field within the object using a special reference indicating that the field is encoded as a difference from the corresponding field in the object referenced.

In some implementations, instead of referring to some previous instance within the same stream, stream compression component 116 may be configured to encode a field or value by referring to the same object in a base version of the stream. As used herein, the same object may comprise an object having the same position within the hierarchy of the structured data. In some implementations, the "base" version may not be present in the stream itself, but may be known to stream decompression component 220 (or some other decoder) using other means. When fields or values are encoded by referencing the same object in a base version of the stream, it is referred to herein as "temporal encoding."

In some implementations, the concept of "temporal encoding" may be extended to apply to the whole object represented by the whole "base" stream. In other words, stream compression component 116 may be configured to encode fields or values by referencing a root object represented by a stream (such as a root of JSON represented by the stream, or a root of an in-memory data structure) and encoding only differences from the "base" stream. In one example, an in-sync version of the game state data may be kept on both server side and client side; then, server, when issuing an update to the game state data, may encode it using an existing in-sync version of the game state data, to form the "base" stream for encoding (and subsequently, client-side decoder may use the same in-sync version of the game state data, to form the same "base" stream for decoding).

In some implementations, updated versions of a temporally-encoded object may contain one or more "manipulation operators." Examples of manipulation operators include an "update field" operator, an "append element to array" or "insert element into array at specific position" operator, a "remove an element from array" operator, a "move an element to a different place within the structured data" operator, and/or other operators that define how data is changed from "current" (or "old") state to the "next" (or "new") one. In some implementations, stream compression component 116 may be configured to generate manipulation operators. In one example, it is possible to monitor all the changes to the data on the encoder side, and issue the manipulation operators according to the changes which happened; for example, whenever an element with value X is appended to the array within the data structure on the encoder side. In such case, a manipulation operator "append an element X" may be generated. In another example, stream compression component 116 may be configured automatically generate manipulation operators by analyzing differences between a base stream and a data structure being encoded into an intermediate symbol stream. For example, if base stream has an array field having its value equal to array [1,2,3], and data structure being encoded, has the same array field having its value equal to array [1,2,3,4]—it is possible to generate a manipulation operator denoting "append value '4' to the end of the array".

In some implementations, stream compression component 116 may be configured to use temporal encoding to encode dynamic structured data (such as game state data). For example, dynamic structured data may need to be manipulated on an encoding side, while also being synchronized to the same state on the decoding side (often, encoding side will be server-side, and decoding side will be client-side). In such implementations, stream compression component 116 may be configured to use data manipulations on the encoding side (such as field updates, adding/removing array elements, and/or other data manipulations) to generate "manipulation operators" for the stream without analyzing difference between a base stream and the structured data being encoded. In other words, for each field update or other data manipulation, stream compression component 116 may be configured to update the data structure and automatically generate a respective "manipulation operator" to reflect the change to the data. Whenever "manipulation operators" are used, decoding/decompression may be performed simply by applying these "manipulation operators" to the "base" data structure (data structure which corresponds to the "base" stream; in case of game state data, it is the game state maintained on the decoding side).

In some implementations, the concept of "temporal encoding" may be used to implement progressive streams. A progressive stream may be used to render a series or sequence of images (or in general, any other objects, such as meshes) of gradually-increasing quality. In various implementations, a progressive stream may include references to another version of the same object within a base stream. For example, in such implementations, stream compression component 116 may be configured to create a progressive stream by having a base version first, then storing a first compressed version that may refer to the base version, and then storing a second compressed version that may refer to either the base version or to the first compressed version, and so on. Accordingly, the progressive stream may use a base stream to encode differences between the base stream and later streams. In various implementations, stream compression component 116 may be configured to utilize this technique to implement a progressive image stream as described in U.S. patent application Ser. No. 18/425,315, entitled "SYSTEMS AND METHODS FOR CREATING EFFICIENT PROGRESSIVE IMAGES," filed Jan. 29, 2024, the content of which is hereby incorporated by reference herein in its entirety. In some implementations, stream compression component 116 may be configured to utilize this technique to implement progressive mesh streams and/ or progressive glTF JSON streams. In other implementations, stream compression component 116 may be configured to produce progressive mesh streams utilizing one or more techniques described in "Cost-Driven Framework for Progressive Compression of Textured Meshes" by Cedric Portaneri et al., which was published in ACM 2019-10th Multimedia Systems Conference, June 2019, at pp. 175-188, the content of which is herein incorporated by reference in its entirety.

In some implementations, stream compression component 116 may be configured to apply an LZ77-like compression method to compress an intermediate symbol stream. In such implementations, stream compression component 116 may be configured to use a modified version of an LZ77-like compression method that refers not to the bytes, but rather to symbols within the intermediate symbol stream. In some cases, a number of symbols may be large enough that the symbols do not fit into a single byte. The modified version of the LZ77-like compression method may be seen as a sequence of "frames," with some frames being "verbatim" frames and others being "back-referencing" frames. The verbatim frames may be encoded as its "size" followed by "size" intermediate symbols; for example, if needing to encode 5 symbols "ABCCD", we may encode number 5 ("size"), followed by 5 symbols "ABCCD". The back-referencing frames may be encoded using "distance" and "size," such that decoding the back-referencing frame may comprise emitting a "size" number of intermediate symbols from a previously-decoded stream starting from "distance" symbols back from a current position within the stream. In some implementations, "distance" and/or "size" may be encoded by a predefined number of bits. In some implementations, stream compression component 116 may be configured to use "integer" encoding described herein to encode "distance" and/or "size." In some implementations, applying an LZ77-like compression method to an intermediate symbol stream may produce a second "intermediate stream," which may be further compressed using one or more entropy coding methods, as described herein. In some implementations, LZ77-like compression streams may be context-dependent. For example, stream compression component 116 may be configured to consider only intermediate symbols which belong to a certain context to belong to the same LZ77-like stream. This will lead to an effective inter-leaving of different LZ77-like streams. In some implementations, stream compression component 116 may be config-ured to use LZ77-like compression for some contexts and not use LZ77-like compression for other contexts.

In some implementations, other frequency tables (with other parameters such as "integer ranges", integer "offsets", etc.) may be used depending on the type of the structured data object being encoded. For example, in some implemen-tations, frequency table creation component 118 may be configured to generate one or more frequency tables described herein for each of multiple different types of objects, and stream compression component 116 may be configured to determine a type of object being encoded and access appropriate frequency tables corresponding to that type of object. In an example implementation, a set of frequency tables may be created and used for each of characters, clothing items, buildings, and/or other three-dimensional objects that may be represented as structured data as described herein. In some implementations, multiple whole trees (or sets) of context-dependent frequency tables may be created and used for individual types of objects.

Stream decompression component 120 may be configured to decompress and decode a compressed bitstream. For example, stream decompression component 120 may be configured to decompress a bitstream compressed as described herein with respect to stream compression com-ponent 120. In various implementations, stream decompres-sion component 120 may be configured to decompress a compressed bitstream using an inverse of one or more entropy coding methods used to compress the bitstream. The decompressed bitstream may comprise the intermediate symbol stream used to generate the compressed bitstream.

In various implementations, stream decompression com-ponent 120 may be configured to decode a decompressed bitstream using multiple frequency tables. For example, stream decompression component 120 may be configured to decode a decompressed bitstream using at least one fre-quency table generated by frequency table creation compo-nent 118 and described herein. In some implementations, frequency tables may be generated (or created) before encoding or decoding structured data. Accordingly, in some implementations, frequency table creation may not be part of the encoding or decoding of the structured data.

In various implementations, stream decompression com-ponent 120 may be configured to determine the frequency table to use based on the type of intermediate stream symbol being decoded. In some implementations, stream decom-pression component 120 may be configured to decode a decompressed bitstream using frequency tables used to encode the structured data as an intermediate symbol stream embedded within the compressed bitstream. In other implementations, frequency tables used to encode the structured data may not be embedded into the compressed bitstream. Instead, frequency tables used to encode structured data may be embedded into a compressor or decompressor. For example, frequency tables used to encode structured data (and needed to decode a compressed bitstream generated from the structured data) may be embedded into a compressor (or stream compression component 116) or decompressor (or stream decompression component 120). In various implementations, frequency tables used to encode structured data may be stored within electronic storage of system 100 that is accessible by stream compression component 116 when encoding the structured data and/or by stream decompression component 120 when decoding the compressed bitstream.

In some implementations, stream compression component 116 may not encode derivable fields. As used herein, "derivable fields" are fields which can be derived from some other data which is present in the stream. Instead, stream decompression component 116 may be configured to restore derivable fields during decompression. For example, when encoding an "accessors" field, stream decompression component 116 may be configured to derive "min" and "max" fields of the "accessors" elements from values in an associated BIN file. As such, these values in a stream may be skipped when encoding structured data and then restored from an associated BIN file. As described herein, BIN data associated with structured data (e.g., glTF JSON data) may be included within the structured data and/or referenced by the structured data. When BIN data is included within the structured data, the BIN data may be encoded within the corresponding intermediate symbol stream. When BIN data is merely referenced by the structured data, the BIN data may not be encoded within the corresponding intermediate symbol stream. In implementations in which derivable values are not encoded, the derivable values may be restored from an associated BIN file regardless whether the BIN file is encoded within the corresponding intermediate symbol stream or is encoded/compressed independently.

In some implementations, a byte stream (such as a JSON file, a JSON chunk of GLB, and/or one or more other types of byte streams) may be parsed into structured data before one or more compression methods are applied, as described herein. In these implementations, stream decompression component 120 may be configured to decompress a compressed bitstream into structured data first (as described herein), and then serialize the structured data into the byte stream (for example, using intermediate stream and subsequent entropy coding).

In various implementations, when parsing input JSON, one of several approaches may be utilized. In some implementations, integer/real types may be distinguished by actual field value found in JSON. In some implementations, runtime detection may be extended to detect- and subsequently encode-additional types, such as "quoted-integer", "quoted-real", and "quoted-Boolean" (e.g., to denote integer, real, and Boolean values which are encoded in quotes). In some implementations, integer, real, and Boolean values may be distinguished by using known information about specifics of the format. For example, if the glTF specification—or a relevant JSON schema-indicates that "byte-Length" field is an integer, it may be relied upon and the compressor (or stream compression component 116) may be configured to reject input JSON that has a floating-point value in "byteLength" field because it is an invalid glTF JSON even if it is a valid JSON.

In various implementations, the techniques described herein for compressing structured data may be used to compress glTF or JSON part of GLB file format. For GLB file formats specifically, the systems and methods described herein may be configured to compress only a structured data chunk (e.g., a JSON chunk) or a structured data chunk plus some or all of BIN data referred to by JSON. In some implementations, the systems and methods described herein may configured to compress all or a portion of any version of glTF, including glTF 1.0, glTF 2.0, and/or any future version of glTF.

In some implementations, when encoding BIN data referred to by JSON, stream compression component 116 may be configured to consider data in BIN buffers as a part of the structured data. For example, stream compression component 116 may be configured to consider data in BIN buffers as a part of the structured data as described by appropriate "accessors" glTF fields. In the foregoing instance, stream compression component 116 may be configured to optionally avoid including "accessors" fields in the encoded bitstream. In some implementations, stream compression component 116 may be configured to encode BIN data as if the BIN data were converted into JSON structures according to the "accessors" fields and place the BIN data into original JSON where "accessors" are placed. Then, this JSON may be encoded according to the techniques described herein. In other implementations, stream compression component 116 may be configured to encode "accessors" as JSON fields while still referring to BIN buffers. In particular, stream compression component 116 may be configured to compress some or all of the BIN data that corresponds to meshes (including glTF "POSITION", "NORMAL", "TANGENT", and "TEXCOORD_*", skinned meshes (including glTF "JOINTS_*" and "WEIGHTS_*"), morph targets (including glTF "POSITION", "NORMAL", and "TANGENT"), and animations (including glTF "translation", "rotation", "scale", and "weights")). In some implementations, if a glTF "accessor" has matrix type (MAT2, MAT3, or MAT4), stream compression component 116 may be configured to treat the matrix as an "array of arrays." In addition, in some implementations, if "accessor" has MAT2 type with 1-byte components, or MAT3 type with either 1-byte or 2-byte components, then some elements in glTF BIN data may be unused due to alignment requirements of glTF. In such cases, stream compression component 116 may be configured to skip encoding unused elements when encoding and fill them in with some predefined value (such as "0") when decoding.

In some implementations, the techniques described herein for compressing (and/or decompressing) structured data may be used to encode any kind of JSON—i.e., not necessarily glTF-based—where the encoded JSON is highly-structured or significantly similar to available samples. In some implementations, similar techniques to those described herein may also be used to encode/compress non-JSON data. For example, the techniques described here may be used to encode/compress any structured data, such as in-memory data structures, or any data specified with an interface description language (IDL).

In some implementations, the techniques described herein for compressing (and/or decompressing) structured data may be used to compress and/or decompress executable code. For example, an executable file may be treated as a sequence of structured headers and/or sections, such as may be specified in an appropriate executable file format (e.g., in Executable and Linkable Format (ELF) or Portable Executable (PE) format). Code sections may be parsed into appropriate assembly (or at least into separate instructions). Then, treating each instruction with its operands as structured data, stream compression component 116 may be configured to encode the instruction with its operands as an intermediate symbol stream, as described herein.

Referring again to FIG. 1, electronic storage 130 may include electronic storage media that electronically stores and/or transmits information. The electronic storage media of electronic storage 130 may be provided integrally (i.e., substantially nonremovable) with one or more components of system 100 and/or removable storage that is connectable to one or more components of system 100 via, for example, a port (e.g., USB port, a Firewire port, and/or other port) or a drive (e.g., a disk drive and/or other drive). Electronic storage 130 may include one or more of optically readable storage media (e.g., optical disks and/or other optically readable storage media), magnetically readable storage media (e.g., magnetic tape, magnetic hard drive, floppy drive, and/or other magnetically readable storage media), electrical charge-based storage media (e.g., EPROM, EEPROM, RAM, and/or other electrical charge-based storage media), solid-state storage media (e.g., flash drive and/or other solid-state storage media), and/or other electronically readable storage media. Electronic storage 130 may be a separate component within system 100, or electronic storage 130 may be provided integrally with one or more other components of system 100 (e.g., computer system 110 or processor 112). Although electronic storage 130 is shown in FIG. 1 as a single entity, this is for illustrative purposes only. In some implementations, electronic storage 130 may comprise a plurality of storage units. These storage units may be physically located within the same device, or electronic storage 130 may represent storage functionality of a plurality of devices operating in coordination.

Electronic storage 130 may store software algorithms, information determined by processor 112, information received remotely, and/or other information that enables system 100 to function properly. For example, electronic storage 130 may store frequency tables, context information defining contexts and their associated frequency tables, information used to encode (and needed to decode) structured data, context-dependent data, and/or other information related to the systems and methods described herein.

Client computing device(s) 140 (also interchangeably referred to herein as client computing device 140, client computing devices 140, or one or more client computing devices 140) may be used by users of system 100 to interface with system 100. Client computing device(s) 140 may be configured as a server device (e.g., having one or more server blades, processors, etc.), a gaming console, a hand-held gaming device, a personal computer (e.g., a desktop computer, a laptop computer, etc.), a smartphone, a tablet computing device, an Internet of Things (IoT) device, a wearable device, and/or other devices that can be programmed to interface with computer system 110.

FIG. 3 illustrates an example of a process 300 for compressing structured data using entropy coding, according to one or more aspects described herein. The operations of process 300 presented below are intended to be illustrative and, as such, should not be viewed as limiting. In some implementations, process 300 may be accomplished with one or more additional operations not described, and/or without one or more of the operations discussed. In some implementations, two or more of the operations of process 300 may occur substantially simultaneously. The described operations may be accomplished using some or all of the system components described in detail above.

In an operation 302, process 300 may include encoding structured data into an intermediate symbol stream. In various implementations, a name and type of each structured data object within the structured data may be encoded as a symbol identified using a frequency table. For example, each structured data object of the structured data may be encoded as a sequence of (name, type, value) triplets. The symbol used to encode the name and type of a structured data object may represent a (name, type) pair of the (name, type, value) triplet for that structured data object. In various implementations, the symbol used to encode the name and type of a structured data object may indicate additional information related to the structured data object. For example, multiple symbols for a given (name, type) pair may be included within a frequency table for that pair, and the symbol used to encode the name and type of a structured data object having that (name, type) pair may be selected based on the additional information. In some implementations, the selected symbol may indicate a type of numerical representation used to encode a real-value field associated with a structured data object. For example, the symbol may indicate that one of decimal floating-point numbers, binary floating-point numbers, and fixed-point numbers was used to encode the real value. In other implementations, the selected symbol may indicate a pre-defined range of an integer field associated with a structured data object, whether an integer field associated with a structured data object is signed or unsigned, and/or whether a Boolean field associated with a structured data object is true or false. In various implementations, the structured data may comprise in-memory data structures and/or JavaScript Object Notation (JSON) data. For example, the structured data may comprise glTF JSON data. In some implementations, the glTF JSON data may include BIN data that is encoded within the intermediate symbol stream. In other implementations, the glTF JSON data may reference BIN data. In such an implementation, the BIN data may not be encoded within the intermediate symbol stream. In some implementations, operation 302 may be performed by a processor component the same as or similar to stream compression component 116 (shown in FIG. 1 and described herein).

In an operation 304, process 300 may include compressing the intermediate symbol stream using one or more entropy coding methods. For example, the one or more entropy coding methods may comprise Huffman coding, arithmetic coding, one of the asymmetric numeral systems (ANS) family of entropy coding methods (such as rANS or tANS), and/or one or more other entropy coding methods. The compressed intermediate symbol stream may comprise a "compressed bitstream." In some implementations, one or more frequency tables used to encode the structured data may be embedded within the compressed bitstream. In other implementations, the frequency table may be embedded within a compressor used to compress the intermediate symbol stream and/or a decompressor used to decompress the compressed bitstream. In some implementations, operation 302 may be performed by a processor component the same as or similar to stream compression component 116 (shown in FIG. 1 and described herein).

FIG. 4 illustrates an example of a process 400 for compressing integer values in structured data, according to one or more aspects described herein. The operations of process 400 presented below are intended to be illustrative and, as such, should not be viewed as limiting. In some implementations, process 400 may be accomplished with one or more additional operations not described, and/or without one or more of the operations discussed. In some implementations, two or more of the operations of process 400 may occur substantially simultaneously. The described operations may be accomplished using some or all of the system components described in detail above.

In an operation 402, process 400 may include accessing a frequency table for integers in structured data. In various implementations, the structured data may comprise in-memory data structures and/or JavaScript Object Notation (JSON) data. For example, the structured data may comprise glTF JSON data. In some implementations, the glTF JSON data may include BIN data that is encoded within the intermediate symbol stream. In other implementations, the glTF JSON data references BIN data. In such an implementation, the BIN data may not be encoded within the intermediate symbol stream. In some implementations, the glTF JSON data may include BIN data that is encoded within the intermediate symbol stream. In other implementations, the glTF JSON data may reference BIN data. In such an implementation, the BIN data may not be encoded within the intermediate symbol stream. In various implementations, the frequency table accessed may be embedded within the intermediate symbol stream, embedded within an encoder used to compress the structured data, stored in electronic storage, and/or otherwise accessible. In various implementations, the frequency table for integers in structured data accessed may indicate a frequency of pre-defined ranges of integer values within structured data. Each pre-defined range may be associated with at least one symbol. This integer-type frequency table may "predict" probable frequencies of pre-defined ranges of integers within integer-type values. In some implementations, the frequency table accessed may be selected from a set of frequency tables for integers in structured data based on a context associated with the integer field. In some implementations, each pre-defined range may be associated with multiple symbols that indicate whether an offset has been applied to the integer value prior to encoding, whether a multiplier has been applied to the integer value prior to encoding, whether the integer is signed or unsigned, and/or other information related to an integer value. In some implementations, operation 402 may be performed by a processor component the same as or similar to stream compression component 116 (shown in FIG. 1 and described herein).

In an operation 404, process 400 may include identifying a pre-defined range in the frequency table corresponding to an integer value in structured data. In some implementations, a symbol associated with the pre-defined range may be selected from a set of symbols associated with the pre-defined range. For example, in some implementations, a pre-defined offset or a pre-defined multiplier may be applied to a value of structured data prior to encoding, and an indication of the pre-defined offset or pre-defined multiplier may be embedded into the intermediate symbol stream. In such implementations, the symbol selected from the frequency table may indicate that the integer value is an offset value or a multiplied value. In some implementations, a symbol may be selected that indicates whether the integer value is a signed or unsigned integer value. In some implementations, operation 404 may be performed by a processor component the same as or similar to stream compression component 116 (shown in FIG. 1 and described herein).

In an operation 406, process 400 may include encoding the integer value within an intermediate symbol stream using a symbol associated with the identified pre-defined range. In various implementations, the integer value may be encoded with the symbol associated with the identified pre-defined range followed by one or more raw bits denoting a position of the integer value within the identified pre-defined range. In some implementations, operation 406 may be performed by a processor component the same as or similar to stream compression component 116 (shown in FIG. 1 and described herein).

In an operation 408, process 400 may include compressing the intermediate symbol stream using one or more entropy coding methods. For example, the one or more entropy coding methods may comprise Huffman coding, arithmetic coding, one of the asymmetric numeral systems (ANS) family of entropy coding methods, and/or one or more other entropy coding methods. The compressed intermediate symbol stream may comprise a "compressed bitstream." In some implementations, operation 408 may be performed by a processor component the same as or similar to stream compression component 116 (shown in FIG. 1 and described herein).

FIG. 5 illustrates an example of a process 500 for decompressing structured data comprising integer values, according to one or more aspects described herein. The operations of process 500 presented below are intended to be illustrative and, as such, should not be viewed as limiting. In some implementations, process 500 may be accomplished with one or more additional operations not described, and/or without one or more of the operations discussed. In some implementations, two or more of the operations of process 500 may occur substantially simultaneously. The described operations may be accomplished using some or all of the system components described in detail above.

In an operation 502, process 500 may include decompressing a compressed bitstream using entropy coding. In various implementations, the compressed bitstream may be decompressed using an inverse of one or more entropy coding methods used to compress the bitstream. For example, the compressed bitstream may be decompressed using an entropy coding method used to compress the intermediate symbol stream in operation 408. In some implementations, operation 502 may be performed by a processor component the same as or similar to stream decompression component 120 (shown in FIG. 1 and described herein).

In an operation 504, process 500 may include accessing a frequency table for integers in structured data. In various implementations, the structured data may comprise in-memory data structures and/or JavaScript Object Notation (JSON) data. For example, the structured data may comprise glTF JSON data. In some implementations, the glTF JSON data may include BIN data that is encoded within the intermediate symbol stream. In other implementations, the glTF JSON data may reference BIN data. In such an implementation, the BIN data may not be encoded within the intermediate symbol stream. In various implementations, the frequency table accessed may be embedded within the intermediate symbol stream, embedded within an encoder used to compress the structured data, stored in electronic storage, and/or otherwise accessible. In various implementations, the frequency table for integers in structured data accessed may indicate a frequency of pre-defined ranges of integer values within structured data. Each pre-defined range may be associated with at least one symbol. In some implementations, the frequency table accessed may be selected from a set of frequency tables for integers in structured data based on a context associated with the integer field. In some implementations, operation 504 may be performed by a processor component the same as or similar to stream decompression component 120 (shown in FIG. 1 and described herein).

In an operation 506, process 500 may include identifying a pre-defined range of integer values in the frequency table that correspond to a symbol for an integer value in the decompressed bitstream. In some implementations, each pre-defined range may be associated with multiple symbols that indicate whether an offset has been applied to the integer value prior to encoding, whether a multiplier has been applied to the integer value prior to encoding, whether the integer is signed or unsigned, and/or other information related to an integer value. As such, in addition to indicating at least a pre-defined range for the integer value, the symbol may indicate whether an offset or multiplier was applied to the integer value prior to encoding, whether the integer is signed or unsigned, and/or other information related to the integer value. In some implementations, operation 506 may be performed by a processor component the same as or similar to stream decompression component 120 (shown in FIG. 1 and described herein).

In an operation 508, process 500 may include determining the integer value based on the identified pre-defined range. In various implementations, determining the integer value based on the identified pre-defined range may comprise using one or more raw bits following the symbol within the decompressed bitstream that denote a position of the integer value within the identified pre-defined range. In implementations in which the symbol indicates that an offset or multiplier was applied to the integer value prior to encoding, determining the integer value may further comprising obtaining a pre-defined offset or multiplier and applying the pre-defined offset or multiplier to the integer value identified using the frequency table. In some implementations, the pre-defined offset or multiplier may be embedded within the decompressed bitstream. In some implementations, operation 508 may be performed by a processor component the same as or similar to stream decompression component 120 (shown in FIG. 1 and described herein).

FIG. 6 illustrates an example of a process 600 for compressing floating-point values in structured data, according to one or more aspects described herein. The operations of process 600 presented below are intended to be illustrative and, as such, should not be viewed as limiting. In some implementations, process 600 may be accomplished with one or more additional operations not described, and/or without one or more of the operations discussed. In some implementations, two or more of the operations of process 600 may occur substantially simultaneously. The described operations may be accomplished using some or all of the system components described in detail above.

In an operation 602, process 600 may include determining sizes of numerical representations of a floating-point value within structured data. For example, for a given floating-point value of structured data, a number of bits required to represent the floating-point value in two or more forms of numerical representation may be determined. In various implementations, the two or more forms of numerical representation selected may be selected from decimal floating-point numbers, binary floating-point numbers, and fixed-point numbers. In various implementations, the structured data may comprise in-memory data structures and/or JavaScript Object Notation (JSON) data. For example, the structured data may comprise glTF JSON data. In some implementations, the glTF JSON data may include BIN data that is encoded within the intermediate symbol stream. In other implementations, the glTF JSON data references BIN data. In such an implementation, the BIN data may not be encoded within the intermediate symbol stream. In some implementations, operation 602 may be performed by a processor component the same as or similar to stream compression component 116 (shown in FIG. 1 and described herein).

In an operation 604, process 600 may include selecting the numerical representation from the two or more forms of numerical representation that requires the fewest number of bits to convey the floating-point value. For example, either decimal floating-point numbers, binary floating-point numbers, or fixed-point numbers may be selected and used to encode the floating-point value. In various implementations, the numerical representation selected for encoding a given floating-point number may be based on an encoded size of the floating-point number using different numerical representations given a desired accuracy. In various implementations, a symbol used to encode a structured data object associated with the floating-point value may indicate the selected numerical representation. In some implementations, operation 604 may be performed by a processor component the same as or similar to stream compression component 116 (shown in FIG. 1 and described herein).

In an operation 606, process 600 may include encoding the floating-point value within an intermediate symbol stream using the selected numerical representation. In various implementations, encoding the floating-point value within an intermediate symbol stream may comprise accessing a frequency table for mantissa integers within structured data, identifying a pre-defined range of mantissa integer values that includes a mantissa integer for the floating-point value, accessing a frequency table for exponent integers within structured data, identifying a pre-defined range of exponent integer values that includes an exponent integer for the floating-point value, and encoding the floating-point value using at least a first symbol associated with the identified pre-defined range of mantissa integer values and a second symbol associated with the identified pre-defined range of exponent integer values. The frequency table for mantissa integers and the frequency table for exponent integers accessed may be based on the numerical representation used. For example, if the selected numerical representation is decimal floating-point numbers, the frequency table for mantissa integers may indicate a frequency of decimal mantissa integer values within structured data, and the frequency table for exponent integers may indicate a frequency of decimal exponent integers within structured data. If the selected numerical representation is binary floating-point numbers, the frequency table for mantissa integers may indicate a frequency of binary mantissa integer values within structured data, and the frequency table for exponent integers may indicate a frequency of binary exponent integers within structured data. Finally, if the selected numerical representation is fixed-point numbers, the frequency table for mantissa integers may indicate a frequency of fixed-point mantissa integer values within structured data; as noted above, there may be no exponent for fixed-point encodings. In various implementations, encoding the floating-point value may include encoding the mantissa integer value using the first symbol followed by one or more raw bits denoting a position of the mantissa integer value within the identified pre-defined range of mantissa integer values and (if applicable) encoding the exponent integer value using the second symbol followed by one or more raw bits denoting a position of the exponent integer value within the identified pre-defined range of exponent integer values. In some implementations, the frequency tables accessed may be selected from a set of frequency tables for mantissa integers and exponent integers in structured data based on a context associated with the floating-point field. In some implementations, the floating-point value may be rounded (or quantized) prior to it being encoded using at least a first symbol and a second symbol. In some implementations, operation 606 may be performed by a processor component the same as or similar to stream compression component 116 (shown in FIG. 1 and described herein).

In an operation 608, process 600 may include compressing the intermediate symbol stream using at least one entropy coding method. For example, the at least one entropy coding method may comprise Huffman coding, arithmetic coding, one of the asymmetric numeral systems (ANS) family of entropy coding methods, and/or one or more other entropy coding methods. The compressed intermediate symbol stream may comprise a "compressed bitstream." In some implementations, operation 608 may be performed by a processor component the same as or similar to stream compression component 116 (shown in FIG. 1 and described herein).

FIG. 7 illustrates an example of a process 700 for decompressing structured data comprising floating-point values, according to one or more aspects described herein. The operations of process 700 presented below are intended to be illustrative and, as such, should not be viewed as limiting. In some implementations, process 700 may be accomplished with one or more additional operations not described, and/or without one or more of the operations discussed. In some implementations, two or more of the operations of process 700 may occur substantially simultaneously. The described operations may be accomplished using some or all of the system components described in detail above.

In an operation 702, process 700 may include decompressing a compressed bitstream using entropy coding. In various implementations, the compressed bitstream may be decompressed using an inverse of one or more entropy coding methods used to compress the bitstream. For example, the compressed bitstream may be decompressed using an entropy coding method used to compress the intermediate symbol stream in operation 608. In some implementations, operation 702 may be performed by a processor component the same as or similar to stream decompression component 120 (shown in FIG. 1 and described herein).

In an operation 704, process 700 may include determining a numerical representation used to encode a floating-point value. For example, either decimal floating-point numbers, binary floating-point numbers, or fixed-point numbers may have been used to encode the floating-point value. In various implementations, a symbol used to encode a structured data object associated with the floating-point value may indicate the numerical representation used to encode a floating-point value. In some implementations, operation 704 may be performed by a processor component the same as or similar to stream decompression component 120 (shown in FIG. 1 and described herein).

In an operation 706, process 700 may include accessing frequency tables for the numerical representation. In various implementations, the structured data may comprise in-memory data structures and/or JavaScript Object Notation (JSON) data. For example, the structured data may comprise glTF JSON data. In some implementations, the glTF JSON data may include BIN data that is encoded within the intermediate symbol stream. In other implementations, the glTF JSON data may reference BIN data. In such an implementation, the BIN data may not be encoded within the intermediate symbol stream. In various implementations, the frequency table accessed may be embedded within the intermediate symbol stream, embedded within an encoder used to compress the structured data, stored in electronic storage, and/or otherwise accessible. In various implementations, the frequency tables accessed may comprise a frequency table for mantissa integers within structured data and a frequency table for exponent integers within structured data. For example, the frequency table for mantissa integers in structured data accessed may indicate a frequency of pre-defined ranges of mantissa integer values within structured data, and the frequency table for exponent integers in structured data accessed may indicate a frequency of pre-defined ranges of exponent integer values within structured data. In various implementations, the frequency table for mantissa integers and the frequency table for exponent integers accessed may be based on the numerical representation used to encode the floating-point value. For example, if the numerical representation used was decimal floating-point numbers, the frequency table for mantissa integers accessed may indicate a frequency of decimal mantissa integer values within structured data, and the frequency table for exponent integers accessed may indicate a frequency of decimal exponent integers within structured data. If the numerical representation used was binary floating-point numbers, the frequency table for mantissa integers accessed may indicate a frequency of binary mantissa integer values within structured data, and the frequency table for exponent integers accessed may indicate a frequency of binary exponent integers within structured data. Finally, if the numerical representation used was fixed-point numbers, the frequency table for mantissa integers accessed may indicate a frequency of fixed-point mantissa integer values within structured data. In some implementations, the frequency tables accessed may be selected from a set of frequency tables for mantissa integers and exponent integers in structured data based on a context associated with the floating-point field. In some implementations, operation 706 may be performed by a processor component the same as or similar to stream decompression component 120 (shown in FIG. 1 and described herein).

In an operation 708, process 700 may include identifying a pre-defined range of mantissa integer values in a frequency table that correspond to a symbol for a mantissa integer value in the decompressed bitstream. In some implementations, operation 708 may be performed by a processor component the same as or similar to stream decompression component 120 (shown in FIG. 1 and described herein).

In an optional operation 710, process 700 may include identifying a pre-defined range of exponent integer values in a frequency table that correspond to a symbol for an exponent integer value in the decompressed bitstream. In some implementations, operation 710 may be performed by a processor component the same as or similar to stream decompression component 120 (shown in FIG. 1 and described herein).

In an operation 712, process 700 may include determining the floating-point value based on the identified pre-defined range of mantissa integer values and (if applicable) the identified pre-defined range of exponent integer values. In various implementations, determining the floating-point value based on the identified pre-defined range of mantissa integer values and the identified pre-defined range of exponent integer values may comprise using one or more raw bits following each symbol within the decompressed bitstream that denote a position of the mantissa integer value and exponent integer value within the identified pre-defined ranges. In some implementations, operation 712 may be performed by a processor component the same as or similar to stream decompression component 120 (shown in FIG. 1 and described herein).

FIG. 8 illustrates an example of a process 800 for performing context-dependent entropy-based compression of structured data, according to one or more aspects described herein. The operations of process 800 presented below are intended to be illustrative and, as such, should not be viewed as limiting. In some implementations, process 800 may be accomplished with one or more additional operations not described, and/or without one or more of the operations discussed. In some implementations, two or more of the operations of process 800 may occur substantially simultaneously. The described operations may be accomplished using some or all of the system components described in detail above.

In an operation 802, process 800 may include determining a context for at least a portion of structured data. In various implementations, the structured data may comprise in-memory data structures and/or JavaScript Object Notation (JSON) data. For example, the structured data may comprise glTF JSON data. In some implementations, the glTF JSON data may include BIN data that is encoded within the intermediate symbol stream. In other implementations, the glTF JSON data may reference BIN data. In such an implementation, the BIN data may not be encoded within the intermediate symbol stream. In various implementations, the portion of the structured data may comprise an object or element within structured data. In some implementations, the context for the portion of the structured data may be determined based on the current encoding situation. For example, as used herein, a "context" may refer to a given encoding situation, such as when a specific element, item, data structure, object, file, and/or application is being encoded. Accordingly, determining a context for at least a portion of structured data may comprise determining a specific element, item, data structure, object, file, and/or application associated with the portion of structured data. In some implementations, a byte stream (such as a JSON file, a JSON chunk of GLB, and/or one or more other types of byte streams) may be parsed into structured data before one or more encoding and/or compression methods are applied, as described herein. For example, a byte stream may be parsed into structured data that is then encoded as intermediate symbol stream and compressed using at least one entropy coding method. In some implementations, operation 802 may be performed by a processor component the same as or similar to stream compression component 116 (shown in FIG. 1 and described herein).

In an operation 804, process 800 may include accessing one or more frequency tables based on the context. For example, the frequency table accessed may be embedded within the intermediate symbol stream, embedded within an encoder used to compress the structured data, stored in electronic storage, and/or otherwise accessible. In various implementations, accessing the one or more frequency tables based on the context may comprise selecting the one or more frequency tables from a set of frequency tables based on the context. In some implementations, frequency tables to be used to encode structured data may be organized into a hierarchy based on a hierarchy of the structured data. In such implementations, the context for the portion of the structured data may be determined based on a position of the portion of the structured data within the structured data. In some implementations, operation 804 may be performed by a processor component the same as or similar to stream compression component 116 (shown in FIG. 1 and described herein).

In an operation 806, process 800 may include encoding at least the portion of the structured data into an intermediate symbol stream using at least one symbol identified from the one or more frequency tables based on the context-dependent data. For example, the portion may comprise an object or element of the structured data and the object or element itself may be encoded using symbol(s) obtained from one or more frequency tables as described herein. In some implementations, the context and/or one or more frequency tables may be implemented on top of a LIFO stack. In such implementations, a symbol indicating the context and/or the one or more frequency tables may be emitted into the intermediate symbol stream prior to encoding at least the portion of the structured data and/or LIFO stack may operate based on data structures themselves, as described herein. In some implementations, the context-dependent data comprises an indication of pre-defined ranges for integers associated with the context within the structured data. The pre-defined range of integers may be used to encode integer values within the structured data. In some implementations, the context-dependent data comprises an indication of a position of the fixed point for floating-point values associated with the context within the structured data encoded as fixed-point numbers. The position of the fixed point may be used to encode floating-point values within the structured data. In some implementations, operation 806 may be performed by a processor component the same as or similar to stream compression component 116 (shown in FIG. 1 and described herein).

In an operation 808, process 800 may include embedding context-dependent data necessary for decoding the structured data into an intermediate symbol stream. In various implementations, an indication of the context and/or the one or more frequency tables used to encode the portion of the structured data may be incorporated into the intermediate symbol stream. For example, the context-dependent data may comprise the frequency tables themselves, derivatives of the frequency tables (e.g., Huffman trees, FSE decoding tables, and/or other frequency table derivatives) or even generated code needed to encode/decode a piece of data (such as name-type pair, integer, etc.) into/out-of an intermediate symbol and/or portion of bitstream. In some implementations, operation 808 may be performed by a processor component the same as or similar to stream compression component 116 (shown in FIG. 1 and described herein).

In an operation 810, process 800 may include compressing the intermediate symbol stream using at least one entropy coding method. For example, the one or more entropy coding methods may comprise Huffman coding, arithmetic coding, one of the asymmetric numeral systems (ANS) family of entropy coding methods, and/or one or more other entropy coding methods. The compressed intermediate symbol stream may comprise a "compressed bitstream." In some implementations, operation 810 may be performed by a processor component the same as or similar to stream compression component 116 (shown in FIG. 1 and described herein).

FIG. 9 illustrates an example of a process 900 for performing context-dependent entropy-based decompression of structured data, according to one or more aspects described herein. The operations of process 900 presented below are intended to be illustrative and, as such, should not be viewed as limiting. In some implementations, process 900 may be accomplished with one or more additional operations not described, and/or without one or more of the operations discussed. In some implementations, two or more of the operations of process 900 may occur substantially simultaneously. The described operations may be accomplished using some or all of the system components described in detail above.

In an operation 902, process 900 may include decompressing a compressed bitstream using entropy coding. In various implementations, the compressed bitstream may be decompressed using an inverse of one or more entropy coding methods used to compress the bitstream. For example, the compressed bitstream may be decompressed using an entropy coding method used to compress the intermediate symbol stream in operation 810. In some implementations, operation 902 may be performed by a processor component the same as or similar to stream decompression component 120 (shown in FIG. 1 and described herein).

In an operation 904, process 900 may include determining a context for at least a portion of structured data. In various implementations, the structured data may comprise in-memory data and/or JavaScript Object Notation (JSON) data. For example, the structured data may comprise glTF JSON data. In some implementations, the glTF JSON data may include BIN data that is encoded within the intermediate symbol stream. In other implementations, the glTF JSON data references BIN data. In such an implementation, the BIN data may not be encoded within the intermediate symbol stream. In various implementations, the portion of the structured data may comprise an object or element within structured data. In some implementations, the context for the portion of the structured data may be determined based on the current encoding situation. For example, as used herein, a "context" may refer to a given encoding situation, such as when a specific element, item, data structure, object, file, and/or application is being encoded. Accordingly, determining a context for at least a portion of structured data may comprise determining a specific element, item, data structure, object, file, and/or application associated with the portion of structured data. In some implementations, the context for at least a portion of structured data may be determined based on an indication of the context embedded within the decompressed bitstream. For example, a symbol indicating the context for structured data may be embedded within the decompressed bitstream prior to one or more symbols used to encode the portion of the structured data. In some implementations, operation 904 may be performed by a processor component the same as or similar to stream decompression component 120 (shown in FIG. 1 and described herein).

In an operation 906, process 900 may include accessing one or more frequency tables based on the context. For example, the frequency table(s) accessed may be embedded within the decompressed bitstream, embedded within an encoder used to compress the structured data, stored in electronic storage, and/or otherwise accessible. In various implementations, accessing the one or more frequency tables based on the context may comprise selecting the one or more frequency tables from a set of frequency tables based on the context. In some implementations, frequency tables to be used to decode structured data may be organized into a hierarchy based on a hierarchy of the structured data. In such implementations, the context for the portion of the structured data may be determined based on a position of the portion of the structured data within the structured data. In some implementations, the context and/or one or more frequency tables may be implemented on top of a LIFO stack. In such implementations, a symbol indicating the context and/or the one or more frequency tables may be emitted into the intermediate symbol stream prior to encoding at least the portion of the structured data and/or LIFO stack may operate based on data structures themselves, as described herein. In some implementations, operation 906 may be performed by a processor component the same as or similar to stream decompression component 120 (shown in FIG. 1 and described herein).

In an operation 908, process 900 may include decoding at least the portion of the structured data using the one or more frequency tables based on a symbol for the portion of the structured data within the decompressed bitstream and context-dependent data embedded within the decompressed bitstream. For example, the portion may comprise an object or element of the structured data and the object or element itself may be encoded using symbol(s) obtained from one or more frequency tables as described herein. Accordingly, decoding the portion of the structured data may comprise identifying the symbol(s) representing the portion of the structured data within one or more frequency tables and determining a corresponding type associated with the structured data as described herein. In various implementations, the symbol(s) may be decoded using the context-dependent data embedded within the decompressed bitstream. For example, the context-dependent data may comprise the frequency tables themselves, derivatives of the frequency tables (e.g., Huffman trees, FSE decoding tables, and/or other frequency table derivatives) or even generated code needed to encode/decode a piece of data (such as name-type pair, integer, etc.) into/out-of an intermediate symbol and/or portion of bitstream. In some implementations, the context-dependent data may comprise an indication of pre-defined ranges for integers associated with the context within the structured data. The pre-defined range of integers may be used to decode integer values within the structured data. In some implementations, the context-dependent data may comprise an indication of a position of the fixed point for floating-point values associated with the context within the structured data encoded as fixed-point numbers. The position of the fixed point may be used to decode floating-point values within the structured data. In some implementations, after a decompressed bitstream is decoded into structured data, the structured data may be serialized into a byte stream. In some implementations, operation 908 may be performed by a processor component the same as or similar to stream decompression component 120 (shown in FIG. 1 and described herein).

FIG. 10 illustrates an example of a process 1000 for improving compression by automatically limiting precision of real values within structured data, according to one or more aspects described herein. The operations of process 1000 presented below are intended to be illustrative and, as such, should not be viewed as limiting. In some implementations, process 1000 may be accomplished with one or more additional operations not described, and/or without one or more of the operations discussed. In some implementations, two or more of the operations of process 1000 may occur substantially simultaneously. The described operations may be accomplished using some or all of the system components described in detail above.

In an operation 1002, process 1000 may include obtaining a combined result, which can be described along the lines of combined_result=calc(field1, field2), where field1 and field2 may be values of two distinct real-value fields in the structured data, and calc may be some calculation. In some implementations, the first field and the second field may comprise cascading three-dimensional transformations; in such a case, the first field may correspond to the first 3D transformation, and the second field may correspond to the second 3D transformation, and calc( ) may correspond to subsequent application of two transformations (which in some embodiments may be expressed in terms of matrix multiplications). In some implementations, the three-dimensional transformations may comprise glTF node transformations. In various implementations, the structured data may comprise in-memory data structures and/or JavaScript Object Notation (JSON) data. For example, the structured data may comprise glTF JSON data. The process described with respect to FIG. 10 may help to avoid compounding rounding errors in such cascading rounded transformations. In some implementations, operation 1002 may be performed by a processor component the same as or similar to stream compression component 116 (shown in FIG. 1 and described herein).

In an operation 1004, process 1000 may include identifying a set of possible techniques for rounding real values in the structured data. For example, the set of possible techniques may comprise at least a first technique and a second technique for rounding the second real value. In an example implementation, the first technique may comprise "rounding up" and the second technique may comprise "rounding down." In some implementations, operation 1004 may be performed by a processor component the same as or similar to stream compression component 116 (shown in FIG. 1 and described herein).

In an operation 1006, process 1000 may include generating at least a first rounded result calculated by: (a) rounding the first field using some rounding technique; (b) rounding the second field using first rounding technique; (c) calculating combined transformation from results of substeps (a) and (b) above. In some implementations, operation 1006 may be performed by a processor component the same as or similar to stream compression component 116 (shown in FIG. 1 and described herein). Note that while discussion with respect to FIG. 10 may refer to 3D transformations for clarity, any kind of calculations resulting in some combined result, may be used in a similar manner.

In an operation 1008, process 1000 may include generating at least a second rounded result calculated by: (a) rounding the first field using some rounding technique (which may be the same as the one used in step 1006(a)); (b) rounding the second field using second rounding technique (which may be different from the one used in step 1006(a)); (e) calculating combined transformation from results of sub-steps (b) and (d) above. In some implementations, operation 1008 may be performed by a processor component the same as or similar to stream compression component 116 (shown in FIG. 1 and described herein).

In an operation 1010, process 1000 may include choosing the rounding technique for rounding the second real value, based on the difference between the result generated based on non-rounded numbers and the first rounded result and the difference between the result generated based on non-rounded numbers and the second rounded result. For example, the difference between the result generated based on non-rounded numbers and the first rounded result may be compared to the difference between the result generated based on non-rounded numbers and the second rounded result. Based on this comparison, the rounding technique that is best for resulting precision of the combined calculation may be selected and used to round the second real value of the second field. For example, the technique may be selected that produces a result with a smaller difference between the result generated based on non-rounded numbers and the result generated based on rounded numbers. Once rounded using the selected technique, the real value may be encoded within an intermediate symbol stream using one or more techniques described herein before the intermediate symbol stream is compressed using at least one entropy coding method. In some implementations, operation 1010 may be performed by a processor component the same as or similar to stream compression component 116 (shown in FIG. 1 and described herein).

FIG. 11 illustrates an example of a process 1100 for compressing dynamic game state data, according to one or more aspects described herein. The operations of process 1100 presented below are intended to be illustrative and, as such, should not be viewed as limiting. In some implementations, process 1100 may be accomplished with one or more additional operations not described, and/or without one or more of the operations discussed. In some implementations, two or more of the operations of process 1100 may occur substantially simultaneously. The described operations may be accomplished using some or all of the system components described in detail above.

In an operation 1102, process 1100 may include encoding structured data into an intermediate symbol stream using reference(s) to a separate base stream. For example, the structured data may comprise at least one object or field, and the structured data may be encoded by referencing a base stream comprising the same object or field. In some implementations, any referenced data in a given stream (e.g., the portion of the base stream referenced in the intermediate symbol stream) may not be copied to or otherwise included within the intermediate symbol stream, instead, only a reference to the base stream may be copied into the intermediate symbol stream. In various implementations, the object or field in the structured data may be encoded into the intermediate symbol stream as a difference between the object or field in the base stream and the object or field in the structured data. In some implementations, the difference between the object or field in the base stream and the object or field in the structured data is encoded as a manipulation operator. A manipulation operator may identify an operation to perform on an object, element, or other piece of data to produce an updated version of the object, element, or other piece of data. Examples of manipulation operators may include appending an element to an array in the structured data, inserting an element into an array in the structured data, removing an element from an array in the structured data, moving an element from one place in the structured data to a different place within the structured data, and/or other operators that define how data is manipulated from one data structure, object, file, or stream to another. In various implementations, a manipulation operator may be generated based on one or more operations performed on a data structure represented by both a base stream and structured data, with the one or more operations reflected in the structured data. For example, the entire base stream may represent a root object and the structured data may represent an updated version of the root object. As described herein, the updated version of the root object may be encoded by referencing the root object. In various implementations, operation 1102 may further comprise updating the data structure and automatically generating the manipulation operator in response to the update to the data structure. In some implementations, the manipulation operator is automatically generated without identifying differences between the base stream and the structured data. In other words, the manipulation operator may be automatically generated based solely on the updates to the data structure on an encoding side. In various implementations, the structured data may comprise game state data. In some implementations, operation 1102 may be performed by a processor component the same as or similar to stream compression component 116 (shown in FIG. 1 and described herein).

In an operation 1104, process 1100 may include compressing the intermediate symbol stream using at least one entropy coding method. For example, the one or more entropy coding methods may comprise Huffman coding, arithmetic coding, one of the asymmetric numeral systems (ANS) family of entropy coding methods, and/or one or more other entropy coding methods. The compressed intermediate symbol stream may comprise a "compressed bit-stream." In some implementations, operation 1104 may be performed by a processor component the same as or similar to stream compression component 116 (shown in FIG. 1 and described herein).

The methods disclosed herein comprise one or more steps or actions for achieving the described method. The method steps and/or actions may be interchanged with one another without departing from the scope of the present invention. In other words, unless a specific order of steps or actions is required for proper operation of the embodiment, the order and/or use of specific steps and/or actions may be modified without departing from the scope of the present invention.

Implementations of the disclosure may be made in hardware, firmware, software, or any suitable combination thereof. Aspects of the disclosure may be implemented as instructions stored on a machine-readable medium, which may be read and executed by one or more processors. A machine-readable medium may include any mechanism for storing or transmitting information in a form readable by a machine (e.g., a computing device). For example, a tangible computer readable storage medium may include read only memory, random access memory, magnetic disk storage media, optical storage media, flash memory devices, and others, and a machine-readable transmission media may include forms of propagated signals, such as carrier waves, infrared signals, digital signals, and others. Firmware, software, routines, or instructions may be described herein in terms of specific exemplary aspects and implementations of the disclosure, and performing certain actions.

The various illustrative logical blocks, modules, circuits, and algorithm steps described in connection with the embodiments disclosed herein may be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application-such as by using any combination of digital processors, analog processors, digital circuits designed to process information, central processing units, graphics processing units, microcontrollers, microprocessors, field programmable gate arrays (FPGAs), application specific integrated circuits (ASICs), a System on a Chip (SoC), and/or other mechanisms for electronically processing information—but such implementation decisions should not be interpreted as causing a departure from the scope of the present invention.

The description of the functionality provided by the different computer-readable instructions described herein is for illustrative purposes, and is not intended to be limiting, as any of instructions may provide more or less functionality than is described. For example, one or more of the instructions may be eliminated, and some or all of its functionality may be provided by other ones of the instructions. As another example, processor(s) 112 may be programmed by one or more additional instructions that may perform some or all of the functionality attributed herein to one of the computer-readable instructions.

The various instructions described herein may be stored in electronic storage, which may comprise random access memory (RAM), read only memory (ROM), and/or other memory. In some implementations, the various instructions described herein may be stored in electronic storage of one or more components of system 100 and/or accessible via a network (e.g., via the Internet, cloud storage, and/or one or more other networks). The electronic storage may store the computer program instructions (e.g., the aforementioned instructions) to be executed by processor(s) 112 as well as data that may be manipulated by processor(s) 112. The electronic storage may comprise floppy disks, hard disks, optical disks, tapes, or other storage media for storing computer-executable instructions and/or data.

Although illustrated in FIG. 1 as a single component, computer system 110 and client computing device(s) 140 may each include a plurality of individual components (e.g., computer devices) each programmed with at least some of the functions described herein. In this manner, some components of computer system 110 and/or associated client computing device(s) may perform some functions while other components may perform other functions, as would be appreciated. Furthermore, it should be appreciated that although the various instructions are illustrated in FIG. 1 as being co-located within a single processing unit, in implementations in which processor(s) 112 include multiple processing units, one or more instructions may be executed remotely from the other instructions.

Although processor computer system 110, electronic storage 130, and client computing device(s) 140 are shown to be connected to interface 102 in FIG. 1, any communication medium may be used to facilitate interaction between any components of system 100. One or more components of system 100 may communicate with each other through hard-wired communication, wireless communication, or both. In various implementations, one or more components of system 100 may communicate with each other through a network. For example, computer system 110 may wirelessly communicate with electronic storage 130. By way of non-limiting example, wireless communication may include one or more of radio communication, Bluetooth communication, Wi-Fi communication, cellular communication, infrared communication, or other wireless communication. Other types of communications are contemplated by the present disclosure.

Reference in this specification to "one implementation", "an implementation", "some implementations", "various implementations", "certain implementations", "other implementations", "one series of implementations", or the like means that a particular feature, design, structure, or characteristic described in connection with the implementation is included in at least one implementation of the disclosure. The appearances of, for example, the phrase "in one implementation" or "in an implementation" in various places in the specification are not necessarily all referring to the same implementation, nor are separate or alternative implementations mutually exclusive of other implementations. Moreover, whether or not there is express reference to an "implementation" or the like, various features are described, which may be variously combined and included in some implementations, but also variously omitted in other implementations. Similarly, various features are described that may be preferences or requirements for some implementations, but not other implementations.

The language used herein has been principally selected for readability and instructional purposes, and it may not have been selected to delineate or circumscribe the inventive subject matter. Other implementations, uses and advantages of the invention will be apparent to those skilled in the art from consideration of the specification and practice of the invention disclosed herein. The specification should be considered exemplary only, and the scope of the invention is accordingly intended to be limited only by the following claims.

What is claimed is:

1. A computer-implemented method of compressing structured data using entropy coding, the method comprising:
   encoding structured data into an intermediate symbol stream, wherein each structured data object of the structured data is encoded as a sequence of (name, type, value) triplets, wherein a name and type of each structured data object of the structured data is encoded as a symbol identified using a frequency table, and wherein the symbol used to encode the name and type of at least one structured data object indicates additional information related to the structured data object; and
   compressing the intermediate symbol stream using at least one entropy coding method.

2. The computer-implemented method of claim 1, wherein the symbol used to encode the name and type of the at least one structured data object represents a (name, type) pair of a (name, type, value) triplet for the at least one structured data object.

3. The computer-implemented method of claim 2, wherein multiple symbols for the (name, type) pair are included within the frequency table, and wherein the symbol used to encode the name and type of the at least one structured data object is selected based on the additional information.

4. The computer-implemented method of claim 3, wherein the selected symbol indicates a type of numerical representation used to encode a real-value field associated with the at least one structured data object, wherein the numerical representation comprises one of decimal floating-point numbers, binary floating-point numbers, and fixed-point numbers.

5. The computer-implemented method of claim 3, wherein the selected symbol indicates a pre-defined range of an integer field associated with the at least one structured data object.

6. The computer-implemented method of claim 3, wherein the selected symbol indicates whether an integer field associated with the at least one structured data object is signed or unsigned.

7. The computer-implemented method of claim 3, wherein the selected symbol indicates whether a Boolean field associated with the at least one structured data object is true or false.

8. The computer-implemented method of claim 1, wherein the structured data comprises in-memory data structure.

9. The computer-implemented method of claim 1, wherein the at least one entropy coding method comprises Huffman coding, arithmetic coding, or one of the asymmetric numeral systems (ANS) family of entropy coding methods.

10. A computer-implemented method of compressing structured data using entropy coding, the method comprising:
   encoding structured data into an intermediate symbol stream, wherein the structured data comprises JavaScript Object Notation (JSON) data, wherein a name and type of each structured data object of the structured data is encoded as a symbol identified using a frequency table, and wherein the symbol used to encode the name and type of at least one structured data object indicates additional information related to the structured data object; and
   compressing the intermediate symbol stream using at least one entropy coding method.

11. The computer-implemented method of claim 10, wherein the JSON data is glTF JSON data.

12. The computer-implemented method of claim 11, wherein the glTF JSON includes BIN data, wherein the BIN data is encoded within the intermediate symbol stream.

13. The computer-implemented method of claim 11, wherein the glTF JSON data references BIN data, wherein the BIN data is not encoded within the intermediate symbol stream.

14. A system for compressing structured data using entropy coding, the system comprising:
   one or more processors configured by computer readable instructions to:
      encode structured data into an intermediate symbol stream, wherein each structured data object of the structured data is encoded as a sequence of (name, type, value) triplets, wherein a name and type of each structured data object of the structured data is encoded as a symbol identified using a frequency table, and wherein the symbol used to encode the name and type of at least one structured data object indicates additional information related to the structured data object; and
      compress the intermediate symbol stream using at least one entropy coding method.

15. The system of claim 14, wherein the symbol used to encode the name and type of the at least one structured data object represents a (name, type) pair of a (name, type, value) triplet for the at least one structured data object.

16. The system of claim 15, wherein multiple symbols for the (name, type) pair are included within the frequency table, and wherein the symbol used to encode the name and type of the at least one structured data object is selected based on the additional information.

17. The system of claim 16, wherein the selected symbol indicates a type of numerical representation used to encode a real-value field associated with the at least one structured data object, wherein the numerical representation comprises one of decimal floating-point numbers, binary floating-point numbers, and fixed-point numbers.

18. The system of claim 16, wherein the selected symbol indicates a pre-defined range of an integer field associated with the at least one structured data object.

19. The system of claim 16, wherein the selected symbol indicates whether an integer field associated with the at least one structured data object is signed or unsigned.

20. The system of claim 16, wherein the selected symbol indicates whether a Boolean field associated with the at least one structured data object is true or false.

21. The system of claim 14, wherein the structured data comprises in-memory data structure.

22. The system of claim 14, wherein the at least one entropy coding method comprises Huffman coding, arithmetic coding, or one of the asymmetric numeral systems (ANS) family of entropy coding methods.

23. A system for compressing structured data using entropy coding, the system comprising:

one or more processors configured by computer readable instructions to:

encode structured data into an intermediate symbol stream, wherein the structured data comprises JavaScript Object Notation (JSON) data, wherein a name and type of each structured data object of the structured data is encoded as a symbol identified using a frequency table, wherein the symbol used to encode the name and type of at least one structured data object indicates additional information related to the structured data object; and compress the intermediate symbol stream using at least one entropy coding method.

24. The system of claim 23, wherein the JSON data is glTF JSON data.

25. The system of claim 24, wherein the glTF JSON includes BIN data, wherein the BIN data is encoded within the intermediate symbol stream.

26. The system of claim 24, wherein the glTF JSON data references BIN data, wherein the BIN data is not encoded within the intermediate symbol stream.

* * * * *